(12) United States Patent
Hatta et al.

(10) Patent No.: US 9,748,441 B2
(45) Date of Patent: Aug. 29, 2017

(54) DRY ETCHING METHOD OF MANUFACTURING SEMICONDUCTOR LIGHT EMITTING DEVICE SUBSTRATE

(71) Applicant: Oji Holdings Corporation, Tokyo (JP)

(72) Inventors: Yoshihisa Hatta, Tokyo (JP); Kei Shinotsuka, Tokyo (JP); Kotaro Dai, Tokyo (JP); Yasuhito Kajita, Tokyo (JP)

(73) Assignee: OJI HOLDINGS CORPORATION, Tokyo (JP)

( * ) Notice: Subject to any disclaimer, the term of this patent is extended or adjusted under 35 U.S.C. 154(b) by 0 days.

(21) Appl. No.: 15/070,684

(22) Filed: Mar. 15, 2016

(65) Prior Publication Data

US 2016/0197236 A1 Jul. 7, 2016

Related U.S. Application Data

(62) Division of application No. 14/422,641, filed as application No. PCT/JP2013/072296 on Aug. 21, 2013, now Pat. No. 9,515,223.

(30) Foreign Application Priority Data

Aug. 21, 2012 (JP) ................... 2012-182302
Jun. 14, 2013 (JP) ................... 2013-126025

(51) Int. Cl.
*H01L 33/20* (2010.01)
*H01L 21/02* (2006.01)
(Continued)

(52) U.S. Cl.
CPC ........ *H01L 33/20* (2013.01); *H01L 21/02019* (2013.01); *H01L 21/0237* (2013.01);
(Continued)

(58) Field of Classification Search
CPC ......... H01L 21/02107; H01L 21/02225; H01L 21/0226; H01L 21/02282; H01L 21/02285;
(Continued)

(56) References Cited

U.S. PATENT DOCUMENTS 4,407,695 A * 10/1983 Deckman ................. B41M 5/24
　　　　　　　　　　　　　　　　　　　　　　　204/192.34
6,010,831 A * 1/2000 Hatakeyama ............ G03F 7/00
　　　　　　　　　　　　　　　　　　　　　　　216/11
(Continued)

FOREIGN PATENT DOCUMENTS

CN　　102064257 A　　5/2011
EP　　　0083510 A2　　7/1983
(Continued)

OTHER PUBLICATIONS

Bart Van Duffel et al, Langmuir-Blodgett deposition and optical diffraction of two-dimensional opal, Journal of Materials and Chemistry, vol. 11, p. 3333-3336, 2001.
(Continued)

*Primary Examiner* — Scott B Geyer
(74) *Attorney, Agent, or Firm* — Knobbe Martens Olson & Bear LLP

(57) ABSTRACT

A method of manufacturing a semiconductor light emitting device, including arranging a plurality of particles in a monolayer on a substrate, dry etching the plurality of particles arranged to provide a void between the particles in a condition IN which the particles are etched while the substrate is not substantially etched; and dry etching the substrate using the plurality of particles after the particle etching step as an etching mask, thereby forming an uneven structure on one surface of the substrate.

9 Claims, 8 Drawing Sheets

(51) Int. Cl.
  *H01L 33/00* (2010.01)
  *H01L 33/50* (2010.01)
  *H01L 21/308* (2006.01)

(52) U.S. Cl.
  CPC ...... *H01L 21/0242* (2013.01); *H01L 21/0243* (2013.01); *H01L 21/0254* (2013.01); *H01L 21/0262* (2013.01); *H01L 21/02282* (2013.01); *H01L 21/02285* (2013.01); *H01L 21/02521* (2013.01); *H01L 21/02658* (2013.01); *H01L 33/007* (2013.01); *H01L 33/0066* (2013.01); *H01L 33/50* (2013.01); *H01L 21/3081* (2013.01); *H01L 21/3086* (2013.01); *H01L 2933/0025* (2013.01)

(58) Field of Classification Search
  CPC ............. H01L 21/02337; H01L 21/027; H01L 21/0271; H01L 21/033; H01L 21/0334; H01L 21/34; H01L 21/461; H01L 21/467; H01L 21/469; H01L 21/47; H01L 21/471; H01L 21/475; H01L 33/005–33/0095; H01L 2933/0025
  See application file for complete search history.

(56) References Cited

U.S. PATENT DOCUMENTS

| | | | |
|---|---|---|---|
| 6,143,580 A * | 11/2000 | Wells | H01L 21/027 118/100 |
| 6,521,541 B2 * | 2/2003 | Rossi | B05D 1/00 257/E21.034 |
| 7,005,079 B2 * | 2/2006 | Chao | C03C 15/00 216/23 |
| 7,029,592 B2 * | 4/2006 | Frendt | B82Y 10/00 216/11 |
| 7,645,625 B2 * | 1/2010 | Ono | H01L 21/30608 438/38 |
| 7,804,101 B2 | 9/2010 | Niki et al. | |
| 8,685,856 B2 * | 4/2014 | Maeda | G02B 1/118 257/437 |
| 8,847,262 B2 | 9/2014 | Narita et al. | |
| 9,034,684 B2 * | 5/2015 | Zhang | H01L 31/02366 438/71 |
| 2003/0022076 A1 * | 1/2003 | Michiels | G03F 7/00 430/5 |
| 2008/0047929 A1 * | 2/2008 | Wang | B29D 11/00365 216/24 |
| 2009/0001398 A1 * | 1/2009 | Song | H01L 33/12 257/98 |
| 2009/0155989 A1 | 6/2009 | Uematsu et al. | |
| 2009/0236629 A1 * | 9/2009 | Nishikawa | H01L 21/3065 257/103 |
| 2009/0274873 A1 * | 11/2009 | Shinotsuka | B82Y 10/00 428/143 |
| 2010/0197055 A1 * | 8/2010 | Tanaka | H01L 21/0237 438/29 |
| 2010/0260977 A1 | 10/2010 | Singh et al. | |
| 2010/0270651 A1 * | 10/2010 | Li | C30B 29/20 257/618 |
| 2011/0108956 A1 | 5/2011 | Haase et al. | |
| 2011/0121431 A1 | 5/2011 | Cui et al. | |
| 2011/0198560 A1 | 8/2011 | Okagawa et al. | |
| 2011/0220936 A1 | 9/2011 | Fujimoto et al. | |
| 2011/0263061 A1 * | 10/2011 | Kim | H01L 33/22 438/39 |
| 2011/0278538 A1 | 11/2011 | Ko et al. | |
| 2011/0294295 A1 * | 12/2011 | Zhu | B81C 1/00031 438/694 |
| 2012/0009768 A1 | 1/2012 | Tadatomo et al. | |
| 2012/0070924 A1 | 3/2012 | Son et al. | |
| 2012/0228656 A1 | 9/2012 | Kamiyama et al. | |
| 2014/0151733 A1 | 6/2014 | Koike et al. | |
| 2015/0048380 A1 | 2/2015 | Koike et al. | |

FOREIGN PATENT DOCUMENTS

| | | |
|---|---|---|
| EP | 2211374 A1 | 7/2010 |
| JP | A-58-120255 | 7/1983 |
| JP | A-06-260682 | 9/1994 |
| JP | A-07-015041 | 1/1995 |
| JP | A-09-036430 | 2/1997 |
| JP | A-09-064419 | 3/1997 |
| JP | A-2002-280611 | 9/2002 |
| JP | A-2003-318441 | 11/2003 |
| JP | A-2005-279807 | 10/2005 |
| JP | A-2007-019318 | 1/2007 |
| JP | A-2007-223864 | 9/2007 |
| JP | A-2009-162831 | 7/2009 |
| JP | A-2009-223154 | 10/2009 |
| JP | A-2011-146522 | 7/2011 |
| JP | A-2011-187787 | 9/2011 |
| JP | B-5359270 | 12/2013 |
| KR | 10-2012-0082179 A | 7/2012 |
| WO | WO 2008/001670 A1 | 1/2008 |

OTHER PUBLICATIONS

Marta Szekeres et al, Ordering and optical properties of monolayers and multilayers of silica spheres deposited by the Langmuir-Blodgett method, Journal of Materials and Chemistry, vol. 12, pp. 3268-3274, 2002.
Taku Shinagawa et al, Light-emitting diodes fabricated on nanopatterned sapphire substrates by thermal lithography, Wiley InterScience Physics Status Solidi C, 2010, 1-3, DOI 10.1002/pssc. 200983518, Wiley-VCH Verlag GmbH and Co KGaA Weinheim.
Office Action in U.S. Appl. No. 14/422,641, mailed Jan. 22, 2016.
International Search Report in International Application No. PCT/JP2013/072296, mailed Sep. 17, 2013.
Extended European Search Report in European Patent Application No. 15156506.6, mailed Jun. 22, 2015.
Notice of Allowance in U.S. Appl. No. 14/422,641, mailed Sep. 21, 2016.
Office Action in European Patent Application No. 15156506.6, mailed Mar. 30, 2016.
Search Report in European Patent Application No. 13830839.0, mailed Apr. 5, 2016.

* cited by examiner

DRY ETCHING METHOD OF MANUFACTURING SEMICONDUCTOR LIGHT EMITTING DEVICE SUBSTRATE

RELATED APPLICATIONS

This application is a divisional of U.S. application Ser. No. 14/422,641, filed Feb. 19, 2015, which is the US National Phase filing under 35 USC 371 of PCT/JP2013/072296, filed Aug. 21, 2013—designating the U.S., and published in Japanese as WO 2014/030670 on Feb. 27, 2014, which claims priority to Japanese Patent Application No. 2012-182302, filed Aug. 21, 2012; and Japanese Patent Application No. 2013-126025, filed Jun. 14, 2013, the entire contents of which are incorporated herein by reference.

TECHNICAL FIELD

The present invention relates to a semiconductor light emitting device substrate, a semiconductor light emitting device and methods of manufacturing these. In particular, the present invention relates to a semiconductor light emitting device substrate suitable for a group III-V nitride semiconductor light emitting device, a semiconductor light emitting device using a substrate obtained by the aforementioned method, and methods of manufacturing these.

Priority is claimed on Japanese Patent Application No. 2012-182302, filed Aug. 21, 2012, and Japanese Patent Application No. 2013-126025, filed Jun. 14, 2013, the contents of which are incorporated herein by reference.

BACKGROUND ART

Semiconductor light emitting devices are used either as an ultraviolet-, blue- or green light emitting diode element, or as an ultraviolet-, blue- or green laser diode element. In particular, group III-V nitride semiconductor light emitting devices having a light emitting layer composed of a group III-V nitride semiconductor that uses nitrogen as a group V element are widely used.

A semiconductor light emitting device substrate for supporting this light emitting structure is formed of sapphire, silicon carbide, silicon or the like, and usually has a lower refractive index than that of a semiconductor layer or the like that constitutes the light emitting structure.

A group III-V nitride semiconductor light emitting device has a basic structure in which an n-type semiconductor layer, a light emitting layer and a p-type semiconductor layer are laminated sequentially on a substrate made of sapphire or the like, and an n-type electrode and a p-type electrode are formed on the n-type semiconductor layer and on the p-type semiconductor layer, respectively. Then, light emitted in the light emitting layer is extracted from the p-type electrode side and/or the substrate side.

A portion of light generated by the light emitting structure is totally reflected repeatedly between the semiconductor light emitting device substrate and the light emitting structure in accordance with the difference in the refractive indices between the semiconductor light emitting device substrate and the light emitting structure. As a result, the light generated by the light emitting structure is attenuated inside the light emitting structure.

In order to solve this problem, by laminating the semiconductor layer after forming an uneven structure on the substrate in advance, various methods have been proposed for changing the light angle to suppress the total reflection by using the uneven structure of the aforementioned uneven substrate, thereby improving the light extraction efficiency (see Patent Documents 1 to 3 and Non-Patent Document 1).

For example, in Patent Documents 1 and 2, it has been proposed to form a mask pattern on a substrate using a photolithography method, form an uneven structure on the substrate by dry etching the aforementioned substrate using the mask pattern, and then form a semiconductor layer on the uneven structure.

In addition, in Patent Document 3, it has been proposed to form an uneven structure on a substrate by dry etching the aforementioned substrate using inorganic particles arranged on the substrate as an etching mask, and then form a semiconductor layer on the uneven structure. In Patent Document 3, as a preferred method of arranging inorganic particles on a substrate, a method has been proposed in which, using a slurry prepared by dispersing inorganic particles in a medium such as water, the aforementioned substrate is immersed in the aforementioned slurry, or the aforementioned slurry is applied or sprayed on the aforementioned substrate followed by drying. In addition, in order to form a favorable semiconductor layer, it has been accepted that inorganic particles should be arranged on the substrate with a coverage of 90% or less.

Further, in Non-Patent Document 1, studies have been made on the relationship between the pitch of an uneven structure to be formed on a substrate and the effect of improving light extraction efficiency. In addition, it has been described that the effect of improving the light extraction efficiency was hardly achieved by an uneven structure with a pitch of 1,000 nm, whereas 170% of light extraction efficiency was achieved by an uneven structure with a pitch of 500 nm, as compared to the case of using a flat substrate.

It should be noted that as a method of producing a fine structure having an uneven structure with a pitch of 1 μm or less, an electron beam lithography method, an interference exposure method and the like have been known conventionally.

CITATION LIST

Patent Documents

[Patent Document 1] Japanese Unexamined Patent Application, First Publication No. 2002-280611
[Patent Document 2] Japanese Unexamined Patent Application, First Publication No. 2003-318441
[Patent Document 3] Japanese Unexamined Patent Application, First Publication No. 2007-19318

Non-Patent Document

[Non-Patent Document 1] Taku Shinagawa, Yuki Abe, Hiroyuki Matsumoto, BoCheng Li, Kazuma Murakami, Narihito Okada, Kazuyuki Tadatomo, Masato Kannaka, and Hideo Fujii, Light-emitting diodes fabricated on nanopatterned sapphire substrates by thermal lithography, 2010 WILEY-VCH Verlag GmbH & Co. KGaA, Weinheim

SUMMARY OF THE INVENTION

Technical Problem

However, according to the method of Patent Documents 1 and 2, there has been a problem of increase in cost due to an increase in the number of photolithography steps. In addition, the fine uneven structure of the semiconductor light emitting device substrate is constituted of a number of convex portions that are arranged on a surface on which the light emitting structure is formed. The more the number of convex portions in the fine uneven structure and the smaller the intervals between the convex portions in the fine uneven structure, the higher the effect of suppressing the total reflection. The fine uneven structure of the semiconductor light emitting device substrate is formed by dry etching the light emitting structure forming surface as described in Patent Documents 1 and 2, for example, and the mask used in the dry etching is formed by photolithography. At this time, since there is a limit in reducing the size of the mask, naturally, there is also a limit in miniaturization of the uneven structure. As shown in Non-Patent Document 1, although it has been desired to make the pitch of the uneven structure 1 µm or less, production of pitches of several micrometers is the limit by laser lithography which is a practical photolithography technique. Therefore, with the method of Patent Documents 1 and 2, it has been difficult to achieve a sufficient light extraction efficiency.

On the other hand, for this reason, in terms of enhancing the extraction efficiency of light generated by the light emitting structure, even with the fine uneven structure described above, there is still a room for improvement.

In addition, due to the effect of diffraction light, problems in the semiconductor light emitting device, such as the color shift and the different radiation intensity (high in-plane anisotropy) depending on the viewing angle, have occurred in some cases.

Furthermore, when a substrate with low flatness is used, since a resist tends to become thick at the recess portion of the substrate, variations occur in the time required until the disappearance of the mask during etching, as a result of which variations occur in the height and shape of the uneven structure and a sufficient light extraction efficiency cannot be achieved. In addition, if an etching mask prepared by nanoimprinting was applied on a substrate with low flatness, a non-patterned portion (planned) was contaminated by the residual resist film, which was also a problem.

For this reason, in preparing a semiconductor light emitting device substrate by conventional photolithography, it has been necessary to use a substrate with high flatness. However, there has been a problem that a substrate with high flatness, especially a sapphire substrate with high flatness could not be obtained without a high level of polishing technique, and was thus very expensive.

In addition, according to the electron beam lithography method or interference exposure, although a fine structure with a pitch of uneven patterns of 1 µm or less can be produced, it is not suited for processing substrates with a large area of about φ2 inches to φ6 inches, such as the semiconductor light emitting device substrate.

In other words, the electron beam lithography method has a slow drawing speed that takes about two weeks to draw 1 inch, and requires a considerable amount of cost and time for the processing of substrates with a large area. In addition, it is difficult to maintain the environment (voltage, vibration, air temperature and the like) constantly during the drawing of a large area over a long period of time, and thus production of a uniform fine structure is difficult.

Further, in the interference exposure method, a Gaussian beam is used as a light source, and an appropriate exposure time would be different at the central portion and at the peripheral portion if the area of the exposure target increases. In addition, it is sensitive to vibration (vibration of ground and building, vibration of air and the like), and the image is blurred to lower the resolution if subjected to the slightest vibration during the exposure time. For this reason, production of a uniform fine structure with a large area is difficult.

The electron beam lithography method and interference exposure method require large and expensive apparatuses, which is also a factor of preventing industrial applications.

In addition, with the method of Patent Document 3 for disposing inorganic particles on a substrate using a slurry prepared by dispersing the inorganic particles in a medium such as water, the inorganic particles easily overlap in many layers, which makes it difficult to produce an etching mask with a uniform thickness. Even if the amount of inorganic particle used is reduced to an extent for covering 90% or less of the substrate, it is difficult to avoid partial overlapping.

Furthermore, as a result of the studies conducted by the inventors of the present invention, it has been discovered that even if the partial overlapping was avoided, inorganic particles are brought into contact with each other at numerous locations, and the substrate at those locations was etched so that the cross sections thereof were a substantially inverted triangular shape. The presence of a flat bottom surface at the recess portion is required for the epitaxial growth of the semiconductor layer on a substrate. For this reason, there was a concern of crystal defects being generated in the semiconductor layer with the method of Patent Document 3.

An aspect of the present invention is made in view of the above-mentioned circumstances and has an object of providing a semiconductor light emitting device with which a sufficient light extraction efficiency can be achieved and also the problems of increases in the color shift and in-plane anisotropy are prevented.

In addition, another aspect of the present invention has an object of providing a semiconductor light emitting device substrate capable of forming a semiconductor layer with few crystal defects and suitable for the manufacture of a semiconductor light emitting device that solves the above problems.

Further, yet another aspect of the present invention has an object of providing a method of manufacturing a semiconductor light emitting device substrate which is capable of manufacturing a semiconductor light emitting device substrate that solves the above problems, and is also capable of forming an uneven structure with a pitch of 1 µm or less by a simple method at low cost and in a short period of time.

Moreover, yet another aspect of the present invention has an object of providing a method of manufacturing a semiconductor light emitting device capable of manufacturing a semiconductor light emitting device that solves the above problems, by using the method of manufacturing a semiconductor light emitting device substrate that solves the above problems.

Solution to Problem

In order to achieve the above objects, some aspects of the present invention employ the following configurations.

[1] A method of manufacturing a semiconductor light emitting device substrate characterized by including:

a particle arranging step for arranging a plurality of particles in a single layer on a substrate so that an arrangement deviation D (%) defined by a formula (1) shown below is not greater than 15%;

a particle etching step for dry etching the aforementioned plurality of particles arranged to provide a void between the particles in a condition by which the aforementioned particles are etched while the aforementioned substrate is not etched substantially; and a substrate etching step for dry etching the aforementioned substrate by using the plurality of particles after the aforementioned particle etching step as an etching mask, thereby forming an uneven structure on one side of the aforementioned substrate:

$$D[\%]=|B-A|\times 100/A \qquad (1)$$

with a proviso that in formula (1), A denotes an average particle diameter of particles, B denotes a most frequent pitch between particles; and |B−A| denotes an absolute value of difference between A and B.

[2] The method of manufacturing a semiconductor light emitting device substrate according to the aspect [1], wherein the aforementioned particle arranging step includes:

a dropping step for dropwise adding a dispersion liquid in which particles are dispersed in a solvent having a smaller specific gravity than water to a liquid surface of water inside a water tank;

a monolayer particle film forming step for forming a monolayer particle film composed of the aforementioned particle on a liquid surface of water by vaporizing the aforementioned solvent; and a transferring step for transferring the aforementioned monolayer particle film onto a substrate.

[3] The method of manufacturing a semiconductor light emitting device substrate according to the aspect [1] or [2], wherein a most frequent pitch between the aforementioned particles is not greater than 5 μm.

[4] The method of manufacturing a semiconductor light emitting device substrate according to the aspect [1] or [2], wherein a most frequent pitch between the aforementioned particles is not greater than 1 μm.

[5] The method of manufacturing a semiconductor light emitting device substrate according to the aspect [1] or [2], wherein a most frequent pitch between the aforementioned particles is from 200 nm to 700 nm.

[6] The method of manufacturing a semiconductor light emitting device substrate according to any one of the aspects [1] to [5], wherein the aforementioned substrate is sapphire, the aforementioned particles are silica, the aforementioned particle etching step is a step of using at least one type of gas selected from the group consisting of $CF_4$, $SF_6$, $CHF_3$, $C_2F_6$, $C_3F_8$, $CH_2F_2$, $O_2$ and $NF_3$ as an etching gas, and the aforementioned substrate etching step is a step of using at least one type of gas selected from the group consisting of $Cl_2$, $Br_2$, $BCl_3$, $SiCl_4$, HBr, HI, HCl and Ar as an etching gas.

[7] A method of manufacturing a semiconductor light emitting device substrate characterized by including:

a particle arranging step for arranging a plurality of particles in a single layer on a substrate;

a particle etching step for dry etching the aforementioned plurality of particles arranged to provide a void between the particles in a condition by which the aforementioned particles are etched while the aforementioned substrate is not etched substantially; and a substrate etching step for dry etching the aforementioned substrate by using the plurality of particles after the aforementioned particle etching step as an etching mask, thereby forming an uneven structure on one side of the aforementioned substrate, wherein the aforementioned substrate is sapphire, the aforementioned particles are silica, the aforementioned particle etching step is a step of using at least one type of gas selected from the group consisting of $CF_4$, $SF_6$, $CHF_3$, $C_2F_6$, $C_3F_8$, $CH_2F_2$, $O_2$ and $NF_3$ as an etching gas, and the aforementioned substrate etching step is a step of using at least one type of gas selected from the group consisting of $Cl_2$, $Br_2$, $BCl_3$, $SiCl_4$, HBr, HI, HCl and Ar as an etching gas.

[8] The method of manufacturing a semiconductor light emitting device substrate according to the aspect [7], wherein the aforementioned particle arranging step includes:

a dropping step for dropwise adding a dispersion liquid in which particles are dispersed in a solvent having a smaller specific gravity than water to a liquid surface of water inside a water tank;

a monolayer particle film forming step for forming a monolayer particle film composed of the aforementioned particle on a liquid surface of water by vaporizing the aforementioned solvent; and a transferring step for transferring the aforementioned single particle film onto a substrate.

[9] The method of manufacturing a semiconductor light emitting device substrate according to any one of the aspects [1] to [8], wherein an absolute difference (TTV) between a maximum thickness and a minimum thickness of the aforementioned substrate as defined by ASTM F657 is from 5 μm to 30 μm, a difference (WARP) between a maximum value and a minimum value of deviation from a reference plane as defined by ASTM F1390 is from 10 μm to 50 μm, and an absolute value (|BOW|) of a distance from a reference plane at a central portion of the substrate as defined by ASTM F534.3.1.2 is from 10 μm to 50 μm.

[10] A method of manufacturing a semiconductor light emitting device substrate, the method including:

a particle arranging step for arranging a plurality of particles in a single layer on an upper surface of a substrate to form a monolayer particle film;

a particle etching step for dry etching the aforementioned plurality of particles arranged to provide a void between the particles in a condition by which the aforementioned particles are etched while the aforementioned substrate is not etched substantially; and a substrate etching step for etching the aforementioned upper surface by using the aforementioned monolayer particle film as a mask, wherein in the aforementioned substrate etching step, a step is formed in a region that is exposed in the upper surface of the aforementioned substrate after the aforementioned particle etching step.

[11] The method of manufacturing a semiconductor light emitting device substrate according to the aspect [10], wherein in the aforementioned particle etching step, a size of each of the aforementioned plurality of particles is reduced.

[12] The method of manufacturing a semiconductor light emitting device substrate according to the aspect [10] or [11], wherein in the aforementioned substrate etching step, of the plurality of particles, the larger a void between two particles, the smaller the aforementioned step.

[13] The method of manufacturing a semiconductor light emitting device substrate according to the aspect [12], wherein in the aforementioned particle arranging step, the aforementioned plurality of particles are arranged by an LB method.

[14] A method of manufacturing a semiconductor light emitting device, the method including:

a step of forming a semiconductor light emitting device substrate by the method of manufacturing a semiconductor light emitting device substrate described in any one of the aspects [10] to [13]; and a step of forming a light emitting structure including a semiconductor layer on the aforementioned upper surface where the aforementioned step is formed in the aforementioned semiconductor light emitting device substrate.

[15] A method of manufacturing a semiconductor light emitting device, the method including:

a step of obtaining a semiconductor light emitting device substrate by the production method according to any one of the aspects [1] to [14]; and a step of laminating a semiconductor functional layer including at least a light emitting layer on a surface of the obtained semiconductor light emitting device substrate where an uneven structure is formed.

[16] A semiconductor light emitting device substrate which is a semiconductor light emitting device substrate including an uneven structure on one surface of the substrate, wherein the aforementioned uneven structure includes numerous convex portions and a flat surface between the convex portions, and also has a plurality of areas in which the central points of seven adjacent convex portions are aligned continuously in a positional relationship so as to become six vertices and intersection point of diagonal lines of a regular hexagon, and an area, shape and lattice orientation of the aforementioned plurality of areas are random.

[17] The semiconductor light emitting device substrate according to the aspect [16], wherein a most frequent pitch of the aforementioned uneven structure is not greater than 5 μm, and an aspect ratio of the aforementioned numerous convex portions is from 0.5 to 1.0.

[18] The semiconductor light emitting device substrate according to the aspect [16], wherein a most frequent pitch of the aforementioned uneven structure is not greater than 1 μm, and an aspect ratio of the aforementioned numerous convex portions is from 0.5 to 1.0.

[19] The semiconductor light emitting device substrate according to the aspect [16], wherein a most frequent pitch of the aforementioned uneven structure is from 200 nm to 700 nm, and an aspect ratio of the aforementioned numerous convex portions is from 0.5 to 1.0.

[20] The semiconductor light emitting device substrate according to any one of the aspects [16] to [19], further including a bridge portion connecting between the aforementioned convex portions.

[21] The semiconductor light emitting device substrate according to any one of the aspects [16] to [20], wherein the aforementioned substrate is sapphire.

[22] A semiconductor light emitting device including:

the semiconductor light emitting device substrate described in any one of the aspects [16] to [20]; and a semiconductor functional layer laminated on the aforementioned semiconductor light emitting device substrate, wherein the aforementioned semiconductor functional layer includes at least a light emitting layer.

[23] The semiconductor light emitting device according to the aspect [22] including a wavelength conversion layer for converting a wavelength of light emitted from the aforementioned light emitting layer to a long wavelength side than a wavelength of the aforementioned light, in a light extraction side of the aforementioned semiconductor functional layer.

[24] The semiconductor light emitting device according to the aspect [23], wherein the aforementioned wavelength conversion layer includes a blue phosphor emitting fluorescence with a peak wavelength of 410 nm to 483 nm, a green phosphor emitting fluorescence with a peak wavelength of 490 nm to 556 nm, and a red phosphor emitting fluorescence with a peak wavelength of 585 nm to 770 nm.

[25] The semiconductor light emitting device according to the aspect [24], wherein the aforementioned wavelength conversion layer includes a yellow phosphor emitting fluorescence with a peak wavelength of 570 nm to 578 nm.

Advantageous Effects of Invention

According to some aspects of the present invention, it is possible to provide a semiconductor light emitting device with which a sufficient light extraction efficiency can be obtained and also the problems of increases in the color shift and in-plane anisotropy are prevented.

In addition, according to some aspects of the present invention, it is possible to provide a semiconductor light emitting device substrate capable of forming a semiconductor layer with few crystal defects and suitable for the manufacture of a semiconductor light emitting device that solves the above problems.

Further, some aspects of the present invention can provide a method of manufacturing a semiconductor light emitting device substrate which is capable of manufacturing a semiconductor light emitting device substrate that solves the above problems, and is also capable of forming an uneven structure with a pitch of not greater than 1 μm by a simple method at low cost and in a short period of time.

Furthermore, some aspects of the present invention can provide a method of manufacturing a semiconductor light emitting device capable of manufacturing a semiconductor light emitting device that solves the above problems by using the method of manufacturing a semiconductor light emitting device substrate that solves the above problems.

DETAILED DESCRIPTION OF THE PREFERRED EMBODIMENTS

First Embodiment

<Semiconductor Light Emitting Ddevice Substrate>

Figure 1:
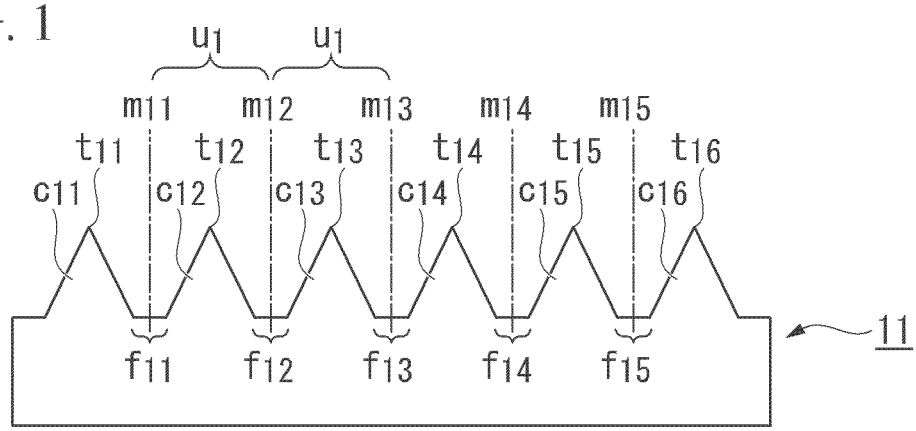
FIG. 1 is a cross-sectional view schematically showing a semiconductor light emitting device substrate of the present invention.

A semiconductor light emitting device substrate 11 according to an embodiment of the present invention will be described using FIGS. 1 and 2. As shown in FIG. 1, the semiconductor light emitting device substrate 11 has an uneven structure on one surface of the substrate.

The uneven structure of the substrate surface has a number of convex portions $c11$ to $c1n$. In addition, present between the convex portions are flat surfaces $f11$ to $f1n$.

$t11$ to $t1n$ in FIG. 1 are central points of the convex portions $c11$ to $c1n$. Based on the measurement results of an atomic force microscope (AFM), a plurality of contour lines are drawn for every 20 nm for the convex portions in parallel to the reference plane to determine the center of gravity (the point determined by the x and y coordinates) of each contour line. The average position of each of these centers of gravity (the position point determined by the average of x coordinates and the average of y coordinates) is the central point of the convex portion.

$m11$ to $m1n$ in FIG. 1 are midpoints of the adjacent central point determined by AFM. In addition, the flat surfaces $f11$ to $f1n$ are regions in which the inclination of a linear line connecting the surface height at the midpoint within that region and the surface height of any point within that region, with respect to the reference plane of the AFM, is equal to or less than $\pm 10°$, based on the AFM measurements.

The periphery of the flat surfaces $f11$ to $f1n$ is preferably present within the distance of 2 nm to 300 nm, and more preferably within the distance of 5 nm to 100 nm, from the middle points $m1$ to $mn$, when a most frequent pitch P of the uneven structure is not greater than 1 μm. When the most frequent pitch P of the uneven structure exceeds 1 μm, the periphery of the flat surfaces $f11$ to $f1n$ is preferably present within the distance of 100 nm to 3000 nm, and more preferably within the distance of 200 nm to 2,000 nm, from the middle points $m11$ to $m1n$.

If the distance between the periphery of the flat surfaces and the midpoints is equal to or more than the preferred lower limit, sufficient area of the flat surface is secured, and it would be easy to epitaxially grow a semiconductor layer stably on the substrate. In addition, if the distance between the periphery of the flat surfaces and the midpoints is equal to or less than the preferred upper limit, it would be easy to form convex portions with sufficient density and to obtain an improved effect of the light extraction efficiency.

Further, convex portions $c11$ to $c1n$ are formed so that the flat surfaces $f11$ to $f1n$ are arranged as follows. Convex portions $c11$ to $c1n$ are formed so that the length of the flat surfaces $f11$ to $f1n$ when viewed in a cross section perpendicular to the substrate, that is, the cross section shown in FIG. 1, through the apex of the convex portions $c11$ to $c1n$ is preferably from 5% to 40%, and more preferably from 15% to 25%, with respect to a straight line connecting the apexes of the two adjacent convex portions of the convex portions $c11$ to $c1n$.

Examples of the shape of the convex portion include a cone, a truncated cone, a bamboo shoot-like shape in which the slope of a cone is bulging outward, a semi-spherical shape, and a shape in which the slope of a truncated cone is bulging outside (a shape prepared by cutting the top of a bamboo shoot-like or semi-spherical shape).

The most frequent pitch P of the uneven structure is preferably from 100 nm to 5 µm, more preferably from 100 nm to 1 µm, still more preferably in the range of 200 nm to 700 nm, and particularly preferably in the range of 300 nm to 600 nm. If the most frequent pitch P is within the preferred range, it is easy to prevent the total reflection of light. In particular, if the most frequent pitch P is equal to or less than 1 µm, it is possible to increase the light extraction efficiency of the blue to violet light more effectively. Therefore, it is suitable as an uneven structure of a substrate used for a semiconductor light emitting device having an emission wavelength of blue to ultraviolet region by carrying out the deposition of GaN, InGaN or the like.

More specifically, the most frequent pitch P is determined in the following manner.

First, in a region that is randomly selected in an uneven surface, by defining a plane parallel to the substrate surface in a square area having one side 30 to 40 times as large as the most frequent pitch P as an AFM reference surface, an AFM image is obtained for the square area. For example, if the most frequent pitch is about 300 nm, an image of an area from 9 µm×9 µm to 12 µm×12 µm is obtained. Then, the image is separated by the waveform through Fourier transform to obtain an FFT image (Fast Fourier transform image). Next, the distance from the zero-order peak to the primary peak in the profile of the FFT image is determined. A reciprocal of the distance thus determined is the most frequent pitch P in this region. Such a process is conducted in a similar manner for regions having the same area of a total of 25 or more locations that are chosen randomly to determine the most frequent pitch in each region. The average value of the most frequent pitches $P_1$ to $P_{25}$ in the regions of 25 or more locations obtained in this manner is the most frequent pitch P. It should be noted that at this time, it is preferable that the regions that are separated by at least 1 mm from each other are selected, and it is more preferable that those that are separated by 5 mm to 1 cm are selected.

A most frequent height H of the convex portion is preferably adjusted between 50 nm and 5 µm. In particular, when the most frequent pitch P is not greater than 1 µm, the most frequent height H of the convex portion is preferably equal to or more than 50 nm and equal to or less than 1 µm, and more preferably equal to or more than 100 nm and equal to or less than 700 nm.

If the most frequent height H is within the preferred range, deposition defects of the nitride compounds to be deposited later are reduced, and, moreover, it is possible to prevent the total reflection of light and to improve the light extraction efficiency.

More specifically, the most frequent height H of the convex portion is determined in the following manner.

First, a cross-section that passes through the apex of the convex portions c11 to c1n along a line having a length of 1 mm in an arbitrary direction and position and is perpendicular to the substrate, that is, the cross-section as in FIG. 1 is obtained from the AFM image. An arbitrary portion containing at least 30 convex portions of the cross section is extracted, and for each convex portion contained therein, a difference between the height of the vertex and the height of the lowest position in a flat portion between the aforementioned convex portion and an adjacent convex portion is determined. The resulting values are rounded with a valid digit number of two digits and defined as a height for each convex portion, and the most frequent value thereof is defined as the most frequent height H.

Figure 2:
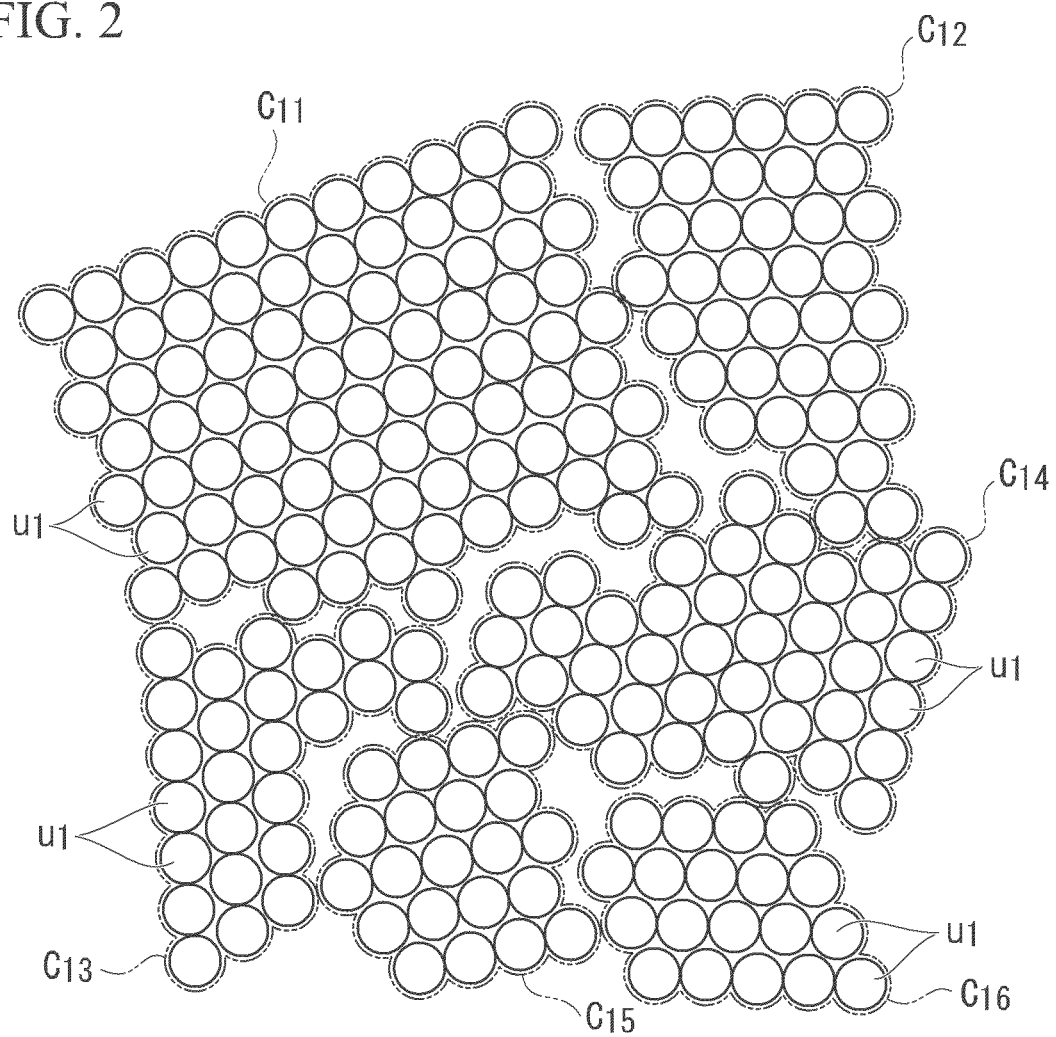
FIG. 2 is a plan view schematically showing a semiconductor light emitting device substrate of the present invention.

As shown in FIG. 2, the semiconductor light emitting device substrate 11 includes a plurality of areas $C_{11}$ to $C_{1n}$.

The areas C11 to C1n are areas in which the central points of seven adjacent convex portions are aligned continuously in a positional relationship so as to become six vertices and intersection point of diagonal lines of a regular hexagon. It should be noted that in FIG. 2, the position of the central point of each convex section is shown, for convenience, by a circle u1 centered on the central point. As shown in FIG. 1, the circle u1 corresponds not only to the convex portion but also to a region including a flat surface in the periphery thereof.

More specifically, in the present embodiment, a positional relationship so that the central points of the seven adjacent convex portions are to become six vertices and intersection point of diagonal lines of a regular hexagon refers to a relationship that satisfies the following conditions.

First, from one central point t11, a line segment L1 having an equal length as the most frequent pitch P in the direction of the adjacent central point t12 is drawn. Then, from the central point t11, with respect to the line segment L1, line segments L2 to L6 having an equal length as the most frequent pitch P are drawn in each direction of 60°, 120°, 180°, 240° and 300°. If the six central points adjacent to the central point t11 are each within the range of 15% or less of the most frequent pitch P from each of the end points of the line segments L1 to L6 on the opposite side of the central point t11, these seven central points are in a positional relationship so as to become six vertices and intersection point of diagonal lines of a regular hexagon.

A most frequent area Q of the areas $C_{11}$ to $C_{1n}$ (most frequent value of the area size) is preferably within the following range.

When the most frequent pitch P is less than 500 nm, the most frequent area Q within the AFM image measuring range of 10 mm×10 mm is preferably from 0.026 µm² to 6.5 mm².

When the most frequent pitch P is equal to or greater than 500 nm and less than 1 µm, the most frequent area Q within the AFM image measuring range of 10 mm×10 mm is preferably from 0.65 µm² to 26 mm².

When the most frequent pitch P is equal to or greater than 1 µm, the most frequent area Q within the AFM image measuring range of 50 mm×50 mm is preferably from 2.6 µm² to 650 mm².

If the most frequent area Q is within the preferred range, it is easy to prevent the problems of increase in the color shift and in-plane anisotropy of light.

In addition, as shown in FIG. 2, the areas $C_{11}$ to $C_{1n}$ have random areas, shapes and lattice orientations. It should be noted that the lattice orientation of areas $C_{11}$ to $C_{1n}$ herein refers to the direction of a primitive translation vector (two vectors are present in the case of triangular lattice) obtained by connecting the vertices of the adjacent convex portions in the same area when viewed from the upper surface of the substrate.

More specifically, the degree of area randomness preferably satisfies the following conditions.

First, an ellipse having the largest area in which boundaries of one area are circumscribed is drawn and the ellipse is represented by the following formula (α).

$$X^2/a^2 + Y^2/b^2 = 1 \qquad (\alpha)$$

When the most frequent pitch P is less than 500 nm, the standard deviation of nab in the AFM image measuring range of 10 mm×10 mm is preferably at least 0.08 µm².

When the most frequent pitch P is equal to or greater than 500 nm and less than 1 μm, the standard deviation of nab in the AFM image measuring range of 10 mm×10 mm is preferably at least 1.95 μm².

When the most frequent pitch P is equal to or greater than 1 μm, the standard deviation of nab in the AFM image measurement range of 50 mm×50 mm is preferably at least 8.58 μm².

If the standard deviation of nab is within the preferred range, the effect of averaging of the diffracted light is excellent.

In addition, more specifically, the degree of the shape randomness of the areas $C_{11}$ to $C_{1n}$ is preferably such that the standard deviation of a/b (ratio of a and b) in the above formula (α) is 0.1 or more.

Further, more specifically, the randomness of the lattice orientation of the areas $C_{11}$ to $C_{1n}$ preferably satisfies the following conditions.

First, a straight line K0 connecting the central points of the two arbitrary adjacent convex portions in an arbitrary area (I) is drawn. Next, one area (II) adjacent to the area (I) is selected, six straight lines K1 to K6 connecting an arbitrary convex portion in the area (II) and the central points of the six convex portions adjacent to the arbitrary convex portion are drawn. If all of straight lines K1 to K6 are different by an angle of 3 degrees or more, with respect to the straight line K0, it is defined that the lattice orientations of the area (I) and the area (II) are different.

Among the areas adjacent to the area (I), it is preferable that two or more areas having a different lattice orientation from the lattice orientation of the area (I) be present, more preferably three or more such areas be present, and still more preferably five or more such areas be present.

The uneven structure of the semiconductor light emitting device substrate 11 has an arrangement like a polycrystalline structure in which the lattice orientation is aligned in each of the areas $C_{11}$ to $C_{1n}$, but is not aligned macroscopically. Macroscopic randomness of lattice orientations can be evaluated by the ratio of the maximum value and the minimum value of the FFT (Fast Fourier Transform) fundamental wave. The ratio of the maximum value and the minimum value of the FFT fundamental wave is determined by obtaining an AFM image and obtaining the two-dimensional Fourier transform image thereof, and then drawing a circle separated from the origin by the wave number of the fundamental wave, extracting a point where the amplitude is the greatest and a point where the amplitude is the smallest on the circumference, and deriving as the ratio of the amplitudes. A method of obtaining the AFM image in this case is the same as the method of obtaining the AFM image in determining the most frequent pitch P.

An uneven structure in which the ratio of the maximum value and the minimum value of the FFT fundamental wave is large has an aligned lattice orientation and can be said to have a structural configuration with high single crystallinity when regarding the uneven structure as a two-dimensional crystal. Conversely, uneven structure in which the ratio of the maximum value and the minimum value of the FFT fundamental wave is small has a non-aligned lattice orientation and can be said to have an arrangement like a polycrystalline structure when regarding the uneven structure as a two-dimensional crystal.

When the uneven structure of the semiconductor light emitting device substrate 11 has a ratio of the maximum value and the minimum value of the FFT fundamental wave within the above preferred range, the diffracted light is not radiated in a particular in-plane direction, and the diffracted light is radiated uniformly. Therefore, there are not cases where the radiation intensity of the semiconductor light emitting device is different depending on the viewing angle. In other words, it is possible to obtain a semiconductor light emitting device with low in-plane radiation anisotropy.

In addition, the occurrence of color shift in the semiconductor light emitting device can also be prevented. Color shift is a phenomenon in which color is different depending on the viewing angle. For example, in those cases where the light wavelength is converted by a phosphor and then the light is once again diffracted in the device due to the uneven structure of the semiconductor light emitting device substrate 11 (a bottom emission type white LED or the like that is provided with a reflective electrode on the upper surface and converts the ultraviolet light to white light by three primary phosphors), the diffracted light overlaps the original spectrum, which results in the intensification of a particular wavelength.

If the uneven structure has a ratio of the maximum value and the minimum value of the FFT fundamental wave within the above preferred range, it is possible to avoid deviation in the emission angle of the diffracted light, and therefore it is possible to suppress the color shift.

The uneven structure of the semiconductor light emitting device substrate 11 has a moderate level of randomness. Therefore, it is possible to prevent the problem of an increase in the color shift and in-plane anisotropy by achieving sufficient light extraction efficiency and also by averaging the diffracted light. In addition, since the space between the convex portions is a flat surface, it is possible to grow a semiconductor layer in a stable manner.

<Method of Manufacturing a Semiconductor Light Emitting Device Substrate>

A method of manufacturing a semiconductor light emitting device substrate according to the present embodiment includes: a particle arranging step for arranging a plurality of particles on a substrate; a particle etching step for dry etching the aforementioned plurality of particles arranged to provide a void between the particles in a condition by which the aforementioned particles are etched while the aforementioned substrate is not etched substantially; and a substrate etching step for dry etching the aforementioned substrate by using the plurality of particles after the aforementioned particle etching step as an etching mask, thereby forming an uneven structure on one side of the aforementioned substrate.

Hereinafter, after describing a substrate (substrate before processing) used in the method of manufacturing a semiconductor light emitting device substrate of the present embodiment, each step will be sequentially described along FIG. 3A to FIG. 3D. It should be noted that in FIG. 3A to FIG. 3D, for convenience of explanation, irregularities formed on particles M and substrate S are extremely enlarged.

[Substrate]

As a material for the substrate, it is possible to use a plate material made of a material, such as sapphire, SiC, Si, $MgAl_2O_4$, $LiTaO_3$, $LiNbO_3$, $ZrB_2$, GaAs, GaP, GaN, AlN, AlGaN, InP, InSn, InAlGaN or $CrB_2$. Among them, in view of mechanical stability, thermal stability, optical stability, chemical stability, and also optical transparency, sapphire is preferred.

The method of manufacturing a semiconductor light emitting device substrate of the present embodiment is capable of accurately forming a desired uneven structure, not only on a substrate with high flatness, but also on a substrate with low flatness. This is because it is possible to accurately form a uniform monolayer particle film mask in a monolayer even on a substrate with low flatness, since a monolayer particle film to be used in the present embodiment is formed, even if there are irregularities to some extent on the substrate, by following them.

More specifically, even when a substrate is used, in which the absolute difference (TTV) between the maximum thickness and the minimum thickness as defined in ASTM F657 is from 5 μm to 30 μm, the difference (WARP) between the maximum value and the minimum value of the deviation from the reference plane as defined in ASTM F1390 is from 10 μm to 50 μm, and the absolute value (|BOW|) of the distance from the reference plane at the center of the substrate as defined by ASTM F534.3.1.2 is from 10 μm to 50 μm, it is possible to obtain a semiconductor light emitting device substrate satisfying the following formula (3).

$$H' = (2.5 \pm 0.5) P^{(0.4 \pm 0.1)} \pm 1.5 \quad (3)$$

Here, H' is a coefficient of variation for the height of the uneven structure, P is the most frequent pitch (μm) of the uneven structure formed on a substrate by the present embodiment.

The coefficient of variation H' is generally determined in the following manner. First, the most frequent height H is determined as described above, and after determining the average value $\mu = \Sigma H/n$ ($\Sigma H$: total number of data, n=the number of data) and standard deviation $\sigma = ((\Sigma(H-\mu)^2)/n)^{(1/2)}$, the coefficient of variation $H' = \sigma/\mu \times 100$ is then determined. In addition, the way of determining the most frequent pitch P is as described above. For the present embodiment, after obtaining the coefficient of variation for each pitch, an empirical formula (3) was obtained by taking the coefficient of variation on the vertical axis and the pitch on the horizontal axis.

If the uneven structure of the semiconductor light emitting device substrate satisfies the formula (3), deposition defects of the nitride compound to be deposited subsequently can be reduced, and it becomes possible to further prevent the total reflection of light to improve the light extraction efficiency. As the condition for reducing the deposition defects, the coefficient of variation H' is preferably 10% or less, more preferably 5% or less, and still more preferably 3% or less. In the present embodiment, it has been found that the formula (3) always holds for the entire surface of the substrate, even when a substrate with low flatness within the range of TTV of 5 μm to 30 μm, WARP of 10 μm to 50 μm, and |BOW| of 10 μm to 50 μm. On the other hand, according to the semiconductor light emitting device substrate prepared by photolithography which is a conventional method, although depending on the thickness of the photoresist used as a mask, the entire surface of the substrate, it is difficult to set the coefficient of variation H' to 10% or less within the abovementioned ranges for the TTV, WARP and |BOW|

[Particle Arranging Step]

Figure 3A:
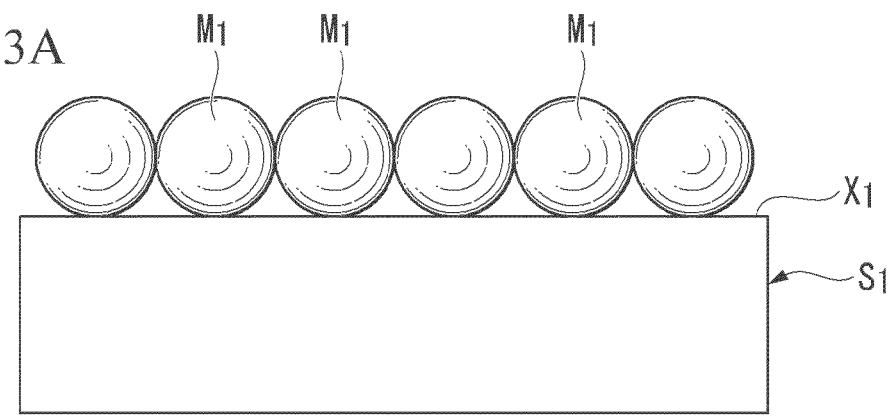
FIG. 3A is an explanatory view of a method of manufacturing a semiconductor light emitting device substrate of the present invention, and shows a state after a particle arranging step.

In the particle arranging step, as shown in FIG. 3A, a plurality of particles $M_1$ are arranged in a single layer on a flat surface X which is one surface of a substrate $S_1$. In other words, a monolayer particle film of particles $M_1$ is formed.

Although the particles $M_1$ are preferably inorganic particles, organic polymer materials and the like can also be used, depending on the conditions. If inorganic particles are used, they can be easily etched in the particle etching step under a condition in which a substrate M is not substantially etched.

As the inorganic particles, for example, it is possible to use particles made of oxides, nitrides, carbides, borides, sulfides, selenides and compounds of metals and the like, metal particles and the like. As the organic particles, thermoplastic resins, such as polystyrene and PMMA, and thermosetting resins, such as phenolic resins and epoxy resins, can be used.

Examples of those that can be used as an oxide include silica, alumina, zirconia, titania, ceria, zinc oxide, tin oxide and yttrium aluminum garnet (YAG), and, furthermore, those in which these constituent elements are partially substituted with another element can also be used.

Examples of those that can be used as a nitride include silicon nitride, aluminum nitride and boron nitride, and, furthermore, those in which these constituent elements are partially substituted with another element can also be used.

For example, compounds such as sialon composed of silicon, aluminum, oxygen and nitrogen can also be used.

Examples of those that can be used as a carbide include SiC, boron carbide, diamond, graphite and fullerenes, and, furthermore, those in which these constituent elements are partially substituted with another element can also be used.

Examples of those that can be used as a boride include $ZrB_2$ and $CrB_2$, and, furthermore, those in which these constituent elements are partially substituted with another element can also be used.

Examples of those that can be used as a sulfide include zinc sulfide, calcium sulfide, cadmium sulfide and strontium sulfide, and, furthermore, those in which these constituent elements are partially substituted with another element can also be used.

Examples of those that can be used as a selenide include zinc selenide and cadmium selenide, and, furthermore, those in which these constituent elements are partially substituted with another element can also be used.

As those that can be used as a metal, particles composed of one or more metals selected from the group consisting of Si, Ni, W, Ta, Cr, Ti, Mg, Ca, Al, Au, Ag and Zn can be used.

The inorganic particles described above can be used not only each independently as particles $M_1$, but also as particles M by mixing these inorganic particles. In addition, coated particles like those obtained by coating inorganic particles composed of a nitride with an oxide can also be used as the particles $M_1$. Furthermore, it is possible to use phosphor particles obtained by introducing an activator such as cerium and europium in the inorganic particles described above as the particles $M_1$.

In addition, the particles $M_1$ may be a mixture of two or more types of particles composed of different materials from each other. Further, the particles $M_1$ may be a laminate composed of different materials, and, for example, may be particles obtained by coating inorganic particles composed of an inorganic nitride with an inorganic oxide.

Among the compounds constituting the inorganic particles described above, oxides are preferred in terms of shape stability, among which silica is more preferred.

In the particle arranging step, a plurality of particles $M_1$ are arranged in a single layer on the substrate $S_1$ so that a deviation D (%) of the arrangement defined by the following formula (1) becomes 15% or less:

$$D[\%] = |B-A| \times 100/A \quad (1)$$

Note that in the formula (1), A denotes an average particle diameter of the particles $M_1$, B denotes the most frequent pitch between the particles $M_1$. Moreover, |B−A| denotes an absolute value of the difference between A and B.

The deviation D is preferably at least 0.5% and not greater than 15%, more preferably at least 1.0 and not greater than 10%, and still more preferably from 1.0% to 3.0%.

Here, the average particle diameter A of particles $M_1$ refers to an average primary particle diameter of the particles $M_1$ constituting a monolayer particle film, and can be determined by a conventional method from a peak obtained by fitting a particle size distribution determined by a particle dynamic light scattering method to a Gaussian curve.

On the other hand, the pitch between the particles M refers to a distance between vertexes of the two adjacent particles $M_1$ in a sheet plane direction, and the most frequent pitch B between the particles $M_1$ is the most frequent value thereof. It should be noted that if the particles $M_1$ have a spherical shape and come into contact with each other without a gap, the distance between the vertexes of adjacent particles $M_1$ is equal to the distance between the centers of adjacent particles $M_1$.

Since the pitch of the uneven structure of the semiconductor light emitting device substrate according to the present embodiment reflects the pitch between the particles $M_1$, the preferred most frequent pitch B between the particles $M_1$ is the same as the preferred most frequent pitch P in the uneven structure of the semiconductor light emitting device substrate according to the present embodiment. That is, the most frequent pitch B between the particles $M_1$ is preferably from 100 nm to 5 μm, more preferably from 100 nm to 1 μm, still more preferably in the range of 200 nm to 700 nm, and particularly preferably in the range of 300 nm to 600 nm.

More specifically, the most frequent pitch B between the particles $M_1$ is obtained in the following manner.

First, in a randomly selected area in a monolayer particle film, an AFM image is obtained for a square region that has one side 30 times to 40 times as large as the most frequent pitch B between the particles $M_1$ and is in parallel to a sheet plane. For example, in the case of a monolayer particle film using a particle $M_1$ having a particle size of 300 nm, an image of an area of 9 μm×9 μm to 12 μm×12 μm is obtained. Then, the image is separated into waveforms through Fourier transformation to obtain an FFT image (Fast Fourier transform image). Next, a distance from the zero-order peak to the primary peak in the profile of the FFT image is determined. The reciprocal of the distance thus determined is the most frequent pitch $B_1$ in this region. Such a process is carried out for regions having the same area in a similar manner over a total of 25 regions or more selected at random to determine the most frequent pitches $B_1$ to $B_{25}$ in each region. An average value of the most frequent pitches $B_1$ to $B_{25}$ in 25 or more regions thus obtained is the most frequent pitch B in the formula (1). It should be noted that in this case, the regions are preferably selected by being separated from each other by at least 1 mm, and more preferably selected by being separated by 5 mm to 1 cm.

In addition, at this time, from the area of the primary peak in the profile of the FFT images, for each image, it is also possible to evaluate the variation in the pitches between the particles M therein.

A deviation D of this arrangement is an indicator indicating the degree of the closest packing of particles $M_1$. That is, a small deviation D of the arrangement of the particles means that the degree of the closest packing high, intervals between the particles are controlled, and the accuracy of the arrangement is high.

Since the deviation D (%) of the arrangement is set to 15% or less, the variation coefficient (a value obtained by dividing the standard deviation by the average value) of the particle size of the particles $M_1$ is preferably 20% or less, more preferably 10% or less, and still more preferably 5% or less.

As described later, the pitch having an uneven structure provided on the substrate $S_1$ according to the present embodiment (the pitch of the central point of the convex portion) is equivalent to the most frequent pitch B between the particles $M_1$. Since the pitch of an uneven structure becomes substantially equivalent to an average particle diameter A of the particles $M_1$ if the deviation D (%) of the arrangement is small, by appropriately selecting the average particle diameter A of the particles $M_1$, it is possible to form the desired uneven structure of the pitch with high accuracy.

In addition, if a most frequent height H with respect to a most frequent size R of the bottom surface of the convex portions c11 to c1$n$ is defined as the aspect ratio, the aspect ratios of the convex portions c11 to c1$n$ are from 0.5 to 1.0. The bottom surface of the convex portion c11 to c1$n$ refers to a surface to be surrounded by the boundary between the flat surface f1$n$ and the convex portion c1$n$. The sizes R11 to R1$n$ of the bottom surface of the convex portions c11 to c1$n$, in a straight line passing through the central point t1$n$, the distance between two points crossing the boundary between the flat surface f1$n$ and the convex portion c1$n$. The most frequent size R can be calculated in the following manner.

First, from an AFM image, an arbitrary portion that can include 30 or more convex portions c1$n$ is extracted, the dimensions of the bottom surface of the convex portion are determined for each convex portion c1$n$ included therein by the above method, the obtained values are rounded by the number of significant figures of two digits, the bottom diameters of each convex portion c1$n$ are denoted as R11 to R1$n$, and the most frequent value thereof is defined as the most frequent size R.

By setting the aspect ratio of the convex portions c11 to c1$n$ from 0.5 to 1.0, light is hardly trapped between the convex portions c11 to c1$n$, thereby improving the light extraction efficiency.

[Particle Arranging Step by LB Method]

The particle arranging step is preferably carried out by a method utilizing the concept of the so-called LB method (Langmuir-Blodgett method).

More specifically, it is preferable to perform the particle arranging step by a method including a dropping step for dropwise adding a dispersion in which particles are dispersed in a solvent having a smaller specific gravity than water to the liquid surface of the water in a water tank, a monolayer particle film forming step for forming a monolayer particle film composed of particles by vaporizing the solvent, and a transfer step for transferring the monolayer particle film onto a substrate.

This method combines the accuracy of conversion into a monolayer, ease of operation, handling of a larger area size, reproducibility and the like. For example, it is highly superior compared to a liquid thin film method described in Nature, Vol. 361, 7 January, 26 (1993) or the like and the so-called particle adsorption method described in Japanese Unexamined Patent Application, First Publication No. Sho 58-120255 or the like, and can also handle the industrial production level.

The particle arranging step the by LB method will be described below in more detail.

(Dropping Step and Monolayer Particle Film Forming Step)

First, a dispersion is prepared by adding particles $M_1$ in a solvent having a specific gravity smaller than that of water. On the other hand, a water tank (trough) is prepared, into which water (hereinafter, also referred to as underlying water in some cases) is poured in order to expand the particles $M_1$ on the liquid surface thereof.

It is preferable that the surface of the particles $M_1$ is hydrophobic. In addition, as a solvent, it is preferable to select a hydrophobic solvent. By combining the hydrophobic particles $M_1$ and solvent and the underlying water, as described later, the self-organization of particles $M_1$ is allowed to proceed, thereby forming a monolayer particle film which is closely packed two-dimensionally.

It is also important that the solvent be highly volatile. Examples of the solvent that is highly volatile and hydrophobic include volatile organic solvents composed of one or more of chloroform, methanol, ethanol, isopropanol, acetone, methyl ethyl ketone, ethyl ethyl ketone, toluene, hexane, cyclohexane, ethyl acetate and butyl acetate.

In those cases where the particles $M_1$ are inorganic particles, since the surface thereof is usually hydrophilic, it is preferable to make them hydrophobic with a hydrophobizing agent for use. As the hydrophobizing agent, a surface active agent, a metal alkoxysilane or the like can be used.

Hydrophobization of the particles $M_1$ can be carried out using the same surface active agent, metal alkoxysilane or the like as the hydrophobizing agent described in Japanese Unexamined Patent Application, First Publication No. 2009-162831 and by the same method described therein.

In addition, in order to further enhance the accuracy of the monolayer particle film to be formed, it is preferable to subject the dispersion liquid before adding dropwise to the liquid surface to microfiltration using a membrane filter or the like to remove the aggregated particles (secondary particles composed of multiple primary particles) present in the dispersion liquid. If the microfiltration is carried out in advance in this manner, portions where two or more layers are partially formed or defective portions where no particles are present are hardly generated, and a monolayer particle film with high accuracy can be easily obtained.

In the transfer step to be described later in more detail, if an LB trough device equipped with a surface pressure sensor for measuring the surface pressure of a monolayer particle film and a movable barrier for compressing the monolayer particle film in the liquid surface direction is used, it is possible to detect the defective portions of the monolayer particle film formed to some extent based on the difference in the surface pressure.

However, defective portions having a size of about several micrometers to several tens of micrometers are less likely to be detected as a difference in the surface pressure. If the microfiltration is carried out in advance, defects having a size of about several micrometers to about several tens of micrometers become less likely to occur, and it becomes easy to obtain a monolayer particle film with high accuracy.

The dispersion liquid described above is added dropwise to the liquid surface of the underlying water (dropping step). Then, the solvent serving as a dispersion medium is volatilized, and at the same time, the particles $M_1$ are expanded in a monolayer on the liquid surface of the underlying water, thereby making it possible to forma monolayer particle film which is closely packed two-dimensionally (monolayer particle film forming step).

It is preferable to set the particle concentration of the dispersion liquid to be added dropwise to the underlying water from 1% by mass to 10% by mass. In addition, it is preferable to set the dropping rate from 0.001 ml/sec to 0.01 ml/sec. If the concentration and addition amount of the particles $M_1$ in the dispersion liquid are within such ranges, tendencies such as partial aggregation of the particles like a cluster to form two or more layers, generation of a defective portion where no particles are present and widening of the pitch between the particles are suppressed. For this reason, a monolayer particle film in which each particle is closely packed two-dimensionally with high accuracy can be obtained more easily.

In the monolayer particle film forming step, a monolayer particle film is formed by the self-organization of particles $M_1$. The principle is that when the particles are assembled, the surface tension caused due to the dispersion medium present between the particles acts, as a result of which the particles $M_1$ are not present randomly from each other but automatically form a two-dimensionally close-packed structure. Such close packing by the surface tension can also be described, in another expression, as an arrangement by capillary force in a transverse direction.

Figure 4:
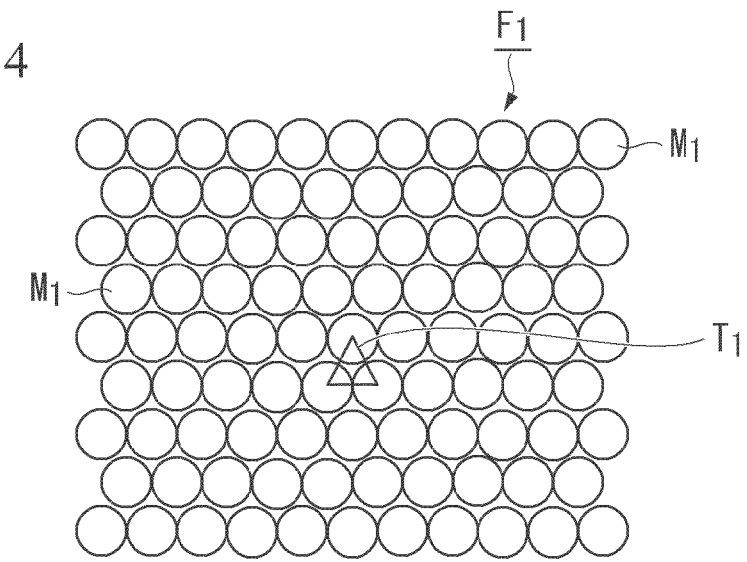
FIG. 4 is a plan view schematically showing particles arranged in a monolayer particle film forming step.

In particular, for example, like colloidal silica, when three particles $M_1$ having a spherical shape with highly uniform particle size are gathered and brought into contact in a state of floating on the water surface, surface tension acts so as to minimize the total length of the waterline of the particle groups. As a result, as shown in FIG. 4, the three particles $M_1$ are stabilized in an arrangement which is based on an equilateral triangle indicated as $T_1$ in the drawing.

The monolayer particle film forming step is preferably carried out in ultrasonic irradiating conditions. When the solvent of the dispersion liquid is volatilized while applying ultrasonic waves from the underlying water toward the water surface, closest packing of particles M is promoted, and a monolayer particle film in which each particle $M_1$ is close-packed two-dimensionally with higher accuracy is obtained. At this time, the output of the ultrasonic wave is preferably from 1 W to 1,200 W and more preferably from 50 W to 600 W.

In addition, although there is no particular limitation on the frequency of ultrasonic waves, for example, it is preferably from 28 kHz to 5 MHz and more preferably from 700 kHz to 2 MHz. If the frequency is too high, since the energy absorption of water molecules begins and a phenomenon in which water vapor or water droplets rise out of the water surface occurs, it is undesirable. On the other hand, if the frequency is too low, cavitation radius in the underlying water increases, and water bubbles are generated in the water and emerge towards the water surface. When such bubbles accumulate under a monolayer particle film, it is disadvantageous since the flatness of the water surface is lost.

A stationary wave is generated on the water surface by ultrasonic irradiation. If the output is too high at any given frequency or the wave height of the water surface is too high depending on the tuning condition of the ultrasonic vibrator and transmitter, a caution is required since a monolayer particle film is destroyed by water waves.

When the frequency and the output of the ultrasonic waves are set appropriately by keeping the above in mind, it is possible to facilitate the close packing of particles effectively without destroying the monolayer particle film which is being formed. In order to perform effective ultrasonic irradiation, it is preferable to use the natural frequency calculated from the size of the particles as a rough guide. However, since the natural frequency becomes extremely high as the particles become small with a particle size of, for example, 100 nm or less, it becomes difficult to give an ultrasonic vibration as the calculation result suggests. In such a case, if a calculation is carried out based on the assumption that the natural frequency corresponding to the mass of the particle from dimers up to about 20-mers is given, it is possible to reduce the frequency required to a practical range. Even when an ultrasonic vibration corresponding to the natural frequency of the aggregates of particles is applied, the effect of improving the fill factor of the particle is expressed. Irradiation time of the ultrasonic waves may be of any length as long as it is sufficient to complete rearrangement of the particles, and the time required varies depending on the particle size, ultrasonic frequency, water temperature and the like. However, under normal preparation conditions, it is preferably carried out from 10 seconds to 60 minutes and more preferably from 3 minutes to 30 minutes.

Other advantages obtained by the ultrasonic irradiation include, in addition to closest packing of the particles (hexagonal close-packing of random arrangements), the effect of destroying a soft aggregate of particles which is likely to occur during preparation of the dispersion liquid of nanoparticles, and the effect of repairing point defects, line defects, crystal transition or the like that has once occurred, to some extent.

(Transfer Step)

A monolayer particle film formed on the liquid surface by the monolayer particle film forming step is then transferred onto a substrate $S_1$ while in a monolayer state (transfer step).

There is no particular limitation on the specific method for transferring a monolayer particle film on the substrate $S_1$, and examples include a method in which the hydrophobic substrate $S_1$ is lowered from above and brought into contact with the monolayer particle film while keeping a state of being substantially parallel to the monolayer particle film, and the monolayer particle film is transferred onto and taken up by the substrate $S_1$ due to the affinity between the monolayer particle film and the substrate that are both hydrophobic; and a method in which the substrate $S_1$ is placed in advance in the underlying water in the water tank in a substantially horizontal direction prior to the formation of the monolayer particle film, and the monolayer particle film is formed on the liquid surface and then the liquid surface is gradually lowered, thereby transferring the monolayer particle film to the substrate $S_1$.

Figure 5A:
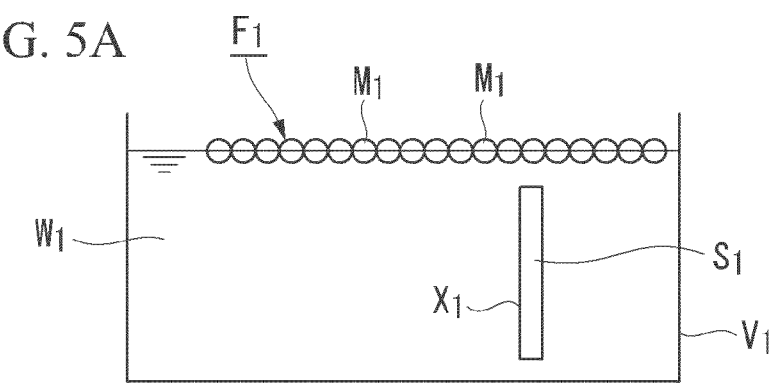
FIG. 5A is an explanatory view of a particle arranging step using an LB method, and shows a state before starting a transfer step.
Figure 5B:
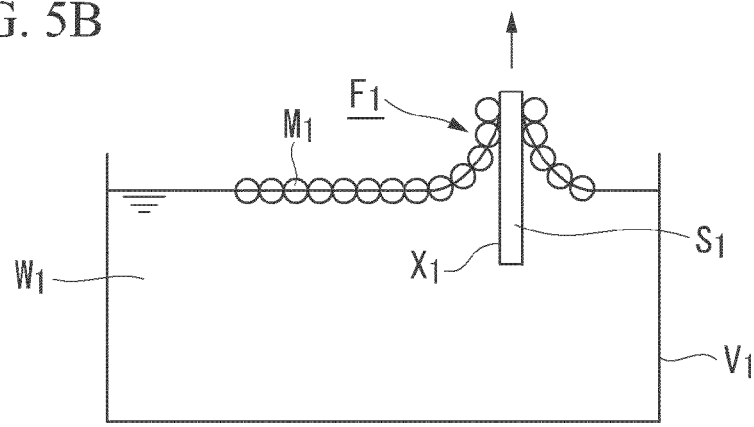
FIG. 5B is an explanatory view of the particle arranging step using an LB method, and shows a state during the transfer step.

Although a monolayer particle film can be transferred onto the substrate $S_1$ by the above methods without using a special device, it is preferable to adopt the so-called LB trough method (see Journal of Materials and Chemistry, Vol. 11, 3333 (2001), Journal of Materials and Chemistry, Vol. 12, 3268 (2002), and the like) in the steps thereafter, in view of easy transfer onto the substrate $S_1$, even when the monolayer particle film has a larger surface area, while maintaining the two-dimensional closest packing state thereof FIGS. 5A and 5B schematically shows the outline of the LB trough method. It should be noted that in FIGS. 5A and 5B, for the convenience of explanation, particles M are extremely enlarged.

In this method, the substrate $S_1$ is previously immersed in advance in underlying water $W_1$ in a water tank $V_1$ in a substantially vertical direction, and the dropping step and the monolayer particle film forming step described above are carried out in that state to form a monolayer particle film $F_1$ (FIG. 5A). Then, after the monolayer particle film forming step, by pulling the substrate $S_1$ upward while maintaining the substantially vertical direction, the monolayer particle film F can be transferred onto the substrate $S_1$ (FIG. 5B).

It should be noted that in this drawing, although a state in which the monolayer particle film $F_1$ is transferred onto both surfaces of the substrate $S_1$ is shown, since an uneven structure may be formed on only one surface of the substrate $S_1$, the monolayer particle film $F_1$ may be transferred only onto a flat surface $X_1$ of the substrate $S_1$. By shielding a surface (back surface) opposite to the flat surface $X_1$ of the substrate $S_1$ with a thick plate, if the monolayer particle film $F_1$ is transferred only to the flat surface $X_1$ in a state of preventing the going around of particles $M_1$ to the back surface from the flat surface $X_1$ side, it is preferable since the monolayer particle film $F_1$ can be transferred more precisely. However, there is no problem even if the transfer takes place on both surfaces.

Here, since the monolayer particle film $F_1$ is formed already in the state of a monolayer on the liquid surface by the monolayer particle film forming step, even if the temperature conditions (temperature of the underlying water), the pulling speed of the substrate $S_1$ or the like in the transfer step is somewhat varied, there is no possibility of the monolayer particle film $F_1$ being collapsed, turned into a multi-layer or the like in the transfer step. It should be noted that the temperature of the underlying water is usually dependent on the ambient temperature that varies due to the season and weather, and is approximately from 10° C. to about 30° C.

In addition, at this time, as the water tank $V_1$, it is preferable to use an LB trough device equipped with a surface pressure sensor not shown for measuring the surface pressure of the monolayer particle film $F_1$ based on the principle, such as a Wilhelmy plate, and a movable barrier not shown for compressing the monolayer particle film $F_1$ in the direction along the liquid surface. According to such a device, it is possible to transfer the monolayer particle film $F_1$ having a large area to the substrate $S_1$ more stably.

That is, according to such a device, the monolayer particle film $F_1$ can be compressed to a preferred diffusion pressure (density) while measuring the surface pressure of the monolayer particle film $F_1$, and also can be moved at a constant speed towards the substrate $S_1$. Therefore, the transfer of the monolayer particle film $F_1$ from the liquid surface to the substrate $S_1$ proceeds smoothly, troubles in which only the monolayer particle film $F_1$ having a small area can be transferred to the substrate $S_1$ or the like are less likely to occur. The diffusion pressure is preferably from 5 mNM$^{-1}$ to 80 mNm$^{-1}$, and more preferably from 10 mNm$^{-1}$ to 40 mNm$^{-1}$. If the diffusion pressure is within such a range, the monolayer particle film $F_1$ in which each particle is close-packed two-dimensionally with higher accuracy can be easily obtained. In addition, the rate for pulling the substrate $S_1$ upward is preferably from 0.5 mNm$^{-1}$ to 20 mm/minute. The temperature of the underlying water is generally from 10° C. to 30° C. as previously described. It should be noted that the LB trough device can be obtained as a commercially available product.

As described above, although it is preferable to transfer the monolayer particle film $F_1$ to the substrate $S_1$ in a state in which each particle is close-packed two-dimensionally with an accuracy as high as possible, no matter how careful the work is carried out, 100% complete close-packing cannot be achieved, and the particles transferred to the substrate $S_1$ becomes a polycrystalline state. As a result, through the steps to be described later, it becomes possible to ultimately form, on the substrate $S_1$, an uneven structure having a plurality of areas in which the central points of seven adjacent convex portions are aligned continuously in a positional relationship so as to become six vertices and intersection point of diagonal lines of a regular hexagon.

(Fixing Step)

Although it is possible to transfer the monolayer particle film $F_1$ of the particles $M_1$ to the substrate $S_1$ by the transfer step, following the transfer step, a fixing step for fixing the transferred monolayer particle film $F_1$ to the substrate $S_1$ may be carried out. With only the transfer step, there is a possibility that the particles $M_1$ would move over the substrate $S_1$ during the particle etching step and the substrate etching step described later. In particular, such a possibility increases at the final stage of the substrate etching step in which the diameter of each particle $M_1$ gets smaller gradually.

By carrying out a fixing step for fixing a monolayer particle film on the substrate $S_1$, possibility of the particles $M_1$ moving on the substrate $S_1$ is suppressed, and etching can be conducted more stably and at a high accuracy.

As a method for the fixing step, there are a method using a binder and a sintering method.

In the method using a binder, a binder solution is supplied to the flat surface X side of the substrate $S_1$ on which a monolayer particle film has been formed, and is infiltrated between the particles $M_1$ constituting the monolayer particle film and the substrate $S_1$.

The amount of binder used is preferably from 0.001 times to 0.02 times the mass of the monolayer particle film. If the amount is within such a range, particles can be fixed sufficiently without causing the problem of excessive amount of binder blocking between the particles $M_1$ to adversely affect the accuracy of the monolayer particle film. In those cases where a large amount of binder solution is supplied, after the binder solution has infiltrated, the excess of the binder solution may be removed by using a spin coater or tilting the substrate $S_1$.

As a binder, it is possible to use the metal alkoxysilanes exemplified earlier as a hydrophobizing agent, common organic binders and inorganic binders or the like, and after the binder solution has infiltrated, a heating treatment may be performed as appropriate depending on the type of the binder. When a metal alkoxysilane is used as a binder, it is preferable to conduct a heat treatment under conditions of 40° C. to 80° C. for 3 minutes to 60 minutes.

When employing the sintering method, it is sufficient to heat the substrate $S_1$ on which a monolayer particle film has been formed so that each particle $M_1$ constituting the monolayer particle film is fused to the substrate $S_1$. Although the heating temperature may be determined in accordance with the material of the particles $M_1$ and the material of the substrate $S_1$, since the particles $M_1$ having a particle size of 1 μmφ or less start the interface reaction at a lower temperature than the original melting point of the material, sintering is completed at a relatively low temperature side. When the heating temperature is too high, the fused area of the particle increases, and, as a result, the shape of the monolayer particle film changes, which may adversely affect the accuracy.

In addition, when the heating is conducted in air, since the substrate $S_1$ and the particles $M_1$ may be oxidized, in the case of employing the sintering method, it is necessary to set the conditions by taking the possibility of such oxidation into consideration. For example, if a silicon substrate is used as the substrate $S_1$ and is sintered at 1,100° C., a thermally oxidized layer having a thickness of about 200 nm is formed on the surface of the substrate $S_1$. It is easy to avoid oxidation when heated in $N_2$ gas or argon gas.

[Particle Arranging Step by Other Methods]

The particle arranging step is not particularly limited as long as a deviation D (%) of the arrangement can be set from 1.0% or more to 15% or less, and, in addition to the LB method, the following method can be employed.

1) A method in which a substrate is immersed in a suspension of colloidal particles, and then particle layers of a second or higher layers are removed while leaving only the particle layer of the first layer which is electrostatically bonded to the substrate (particle adsorption method), thereby providing an etching mask composed of a monolayer particle film on the substrate (see Japanese Unexamined Patent Application, First Publication No. Sho 58-120255).

2) A method in which a binder layer is formed on a substrate, a dispersion liquid of particles is applied thereon, and then the binder layer is softened by heating, thereby embedding only a particle layer of the first layer in the binder layer to wash off the excess particles (see Japanese Unexamined Patent Application, First Publication No. 2005-279807).

[Particle Etching Step]

Figure 3B:
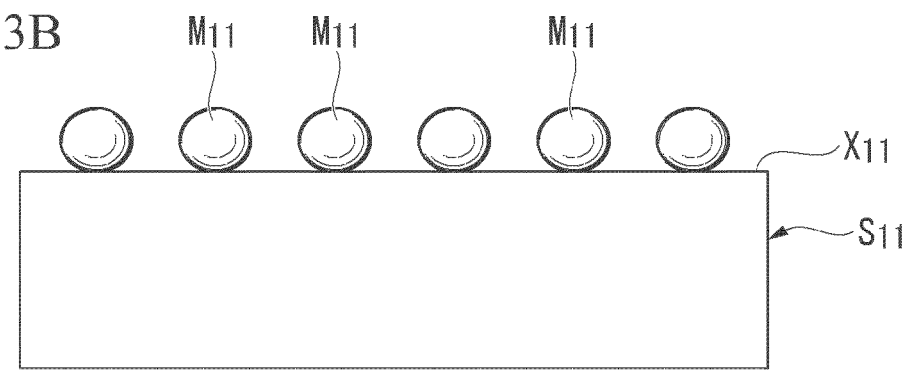
FIG. 3B is an explanatory view of a method of manufacturing a semiconductor light emitting device substrate of the present invention, and shows a state after a particle etching step.

In the particle etching step, a plurality of particles $M_1$ arranged in conditions so as not to substantially etch the substrate $S_1$ are dry etched. As a result, as shown in FIG. 3B, only particles $M_1$ are substantially etched to form particles $M_{11}$ having a small particle diameter, and gaps are provided between the particles $M_{11}$. On the other hand, the substrate $S_{11}$ after the particle etching step is substantially the same as the substrate $S_1$, while no substantial irregularities are formed on a flat surface $X_{11}$ which is one surface of the substrate $S_{11}$, and thus the flat surface $X_{11}$ and the flat surface $X_1$ are equivalent.

As the conditions in which the substrate $S_1$ is not substantially etched, dry etching selection ratio in the following equation (2) is preferably 25% or less, more preferably 15% or less, and still more preferably 10% or less.

$$\text{Dry etching selectivity [\%]} = (\text{dry etching rate of substrate } S_1)/(\text{dry etching rate of particle } M_1) \times 100 \qquad (2)$$

In order to achieve such dry etching conditions, an etching gas may be selected appropriately. For example, in those cases where a substrate S is sapphire and particles $M_1$ are silica, if dry etching is carried out using one or more gases selected from $CF_4$, $SF_6$, $CHF_3$, $C_2F_6$, $C_3F_8$, $CH_2F_2$, $O_2$ and $NF_3$, the particle $M_1$ can be etched with little adverse effect on the substrate $S_1$. Alternatively, when a substrate S is sapphire and particles $M_1$ are titania ($TiO_2$), if dry etching is carried out using one or more gases selected from $CF_4$, $SF_6$, $CHF_3$, $C_2F_6$, $C_3F_8$, $CH_2F_2$, $O_2$ and $NF_3$, the same effect as described above can be achieved. Alternatively, when a substrate S is sapphire and particles $M_1$ are polystyrene, if dry etching is carried out using one or more gases selected from $CF_4$, $SF_6$, $CHF_3$, $C_2F_6$, $C_3F_8$, $CH_2F_2$, $O_2$ and $NF_3$, the same effect as described above can be achieved. Alternatively, when a substrate S is silicon and particles $M_1$ are polystyrene, if dry etching is carried out using $O_2$ gas, the same effect as described above can be achieved.

Since the particles $M_{11}$ following the particle etching step are used as an etching mask in the subsequent substrate etching step, it is necessary to sufficiently leave the diameter (hereinafter, referred to as "height") of the substrate $S_1$ in the thickness direction (vertical direction). In addition, in order to prepare the etching mask in which the particles $M_{11}$ are sufficiently spaced, it is necessary that the size (hereinafter, referred to as "area") of the particle $M_{11}$ in the plane direction (horizontal direction) of the substrate $S_1$ be sufficiently small. Therefore, the particle etching step is preferably carried out under the conditions to reduce the area while suppressing the reduction in height.

In order to achieve the above condition, it is sufficient to set the bias power to a lower level, or set the pressure to a low pressure.

[Substrate Etching Step]

Figure 3C:
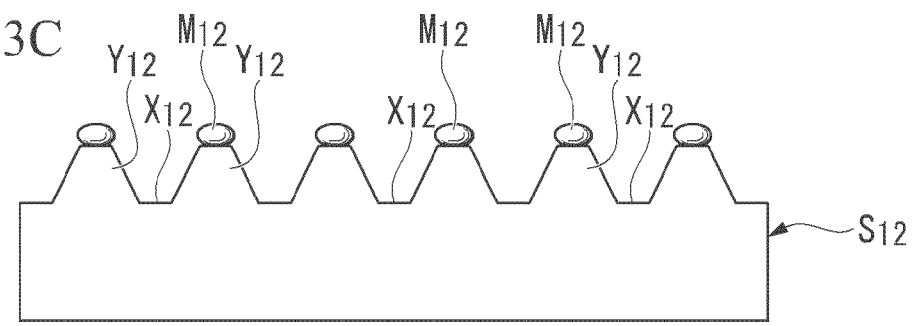
FIG. 3C is an explanatory view of a method of manufacturing a semiconductor light emitting device substrate of the present invention, and shows a state in the middle of a substrate etching step.

In the substrate etching step, the substrate $S_{11}$ following the particle etching step is dry etched using the particle $M_{11}$ after the particle etching step as an etching mask. Since the substrate $S_{11}$ is first exposed to the etching gas in the gaps between the particles $M_{11}$, these portions are etched in advance while maintaining the flatness. In addition, since the particles $M_{11}$ are also etched gradually become small, etching of the substrate $S_{11}$ proceeds gradually from the lower part of the periphery toward the lower part of the center of each particle $M_{11}$. As a result, as shown in FIG. 3C, the particles $M_{11}$ become particles $M_{12}$ having an even smaller particle diameter. In addition, on a substrate $S_{12}$ at this time point, a plurality of convex portions $Y_{12}$ of a truncated cone shape having the lower side of each particle $M_{12}$ as a top surface are formed. The void between the convex portions $Y_{12}$ (bottom surface of the recess portion) substantially corresponds to the void between the particles $M_{11}$, and that portion becomes a flat surface $X_{12}$.

Figure 3D:
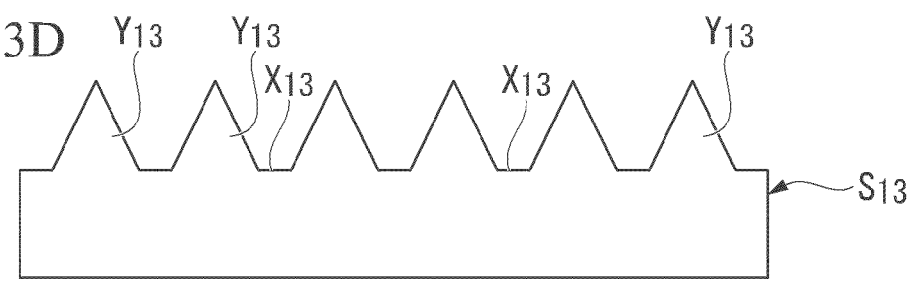
FIG. 3D is an explanatory view of a method of manufacturing a semiconductor light emitting device substrate of the present invention, and shows a state after the substrate etching step.

If the substrate etching step is allowed to proceed further, each particle $M_{12}$ ultimately disappears by etching. As a result, as shown in FIG. 3D, on a substrate $S_{13}$ after completion of the substrate etching step, a plurality of convex portions $Y_{13}$ of a truncated cone shape having the lower side of the central part of each particle $M_{12}$ as a vertex are formed. The void between the convex portions $Y_{13}$ (bottom surface of the recess portion) becomes a flat surface $X_{13}$. The flat surface $X_{13}$ substantially corresponds to the void between the particles $M_{11}$ and the flat surface $X_{12}$, and becomes a bottom surface of a recess portion which is even deeper than the flat surface $X_{12}$.

In the substrate etching step, the dry etching rate of the substrate $S_{12}$ (substrate $S_1$) needs to be greater than the etching rate of the particles $M_{12}$ (particles $M_1$), and it is required that the dry etching selection ratio in the aforementioned equation (2) be greater than 100%. The dry etching selection ratio in the aforementioned equation (2) in the substrate etching step is preferably 200% or more, and more preferably 300% or more.

It should be noted that for such etching conditions, the etching gas used in the reactive etching may be selected appropriately. For example, when the device substrate $S_1$ is sapphire and the particles $M_1$ are silica, one or more gases selected from the group consisting of $Cl_2$, $Br_2$, $BCl_3$, $SiCl_4$, HBr, HI, HCl and Ar may be used as an etching gas.

As an available etching device, be one there is no particular restriction on the specifications such as the plasma generation method, the structure of the electrode, the structure of the chamber and the frequency of the high-frequency power supply, as long as it is capable of anisotropic etching and generating a minimum of bias field of about 20 W, such as a reactive ion etching apparatus and an ion beam etching apparatus.

The substrate etching step is preferably carried out by holding the temperature inside the chamber from 60° C. to 200° C., and more preferably carried out by holding the temperature from 80° C. to 150° C.

By holding the temperature inside the chamber to the above-mentioned temperature, since the etching rate of the substrate is increased and the handling is easy, it is possible to improve the manufacturing efficiency.

In those cases where the substrate is a sapphire substrate, it is particularly preferable to carry out the substrate etching step at the above temperature.

The shape of the convex portion $Y_{13}$ can be adjusted depending on the bias power, the pressure in the vacuum chamber and the type of the etching gas. For example, if the pressure is lowered, a shape with a gradual inclination angle is obtained.

It should be noted that it is also possible to end the substrate etching step at a stage depicted in FIG. 3C to form a convex portion with a truncated cone shape. In that case, the remaining particles $M_{12}$ can be removed by a chemical removal method using an etching gas having etchability with respect to the particle $M_{12}$ and etching resistance with respect to the substrate $S_{12}$, or a physical removal method using a brush roll washing machine and the like.

A pitch of the uneven structure provided on the substrate $S_1$ in the present embodiment is equivalent to the most frequent pitch B between the particles $M_1$ described above. Since the degree of close packing of the arrangement of the particles $M_1$ in FIG. 3A is high, by appropriately selecting an average particle diameter A of particles $M_1$, it is possible to form an uneven structure having a desired pitch with good accuracy.

In addition, since the particle etching step is carried out prior to the substrate etching step, the space between the convex portions, that is, the bottom surface of the recess portion can be formed as a flat surface. For this reason, a semiconductor layer can be grown stably on a flat surface. Therefore, a substrate for a semiconductor light emitting device which is less likely to generate crystal defects in the semiconductor layer can be prepared.

According to the manufacturing method of the present embodiment, the cost and time required for producing a relatively small uneven structure with a pitch of 1 μm or less (sub-micron pitch) may be less than the cost and time required for producing a relatively large uneven structure with a pitch of several micrometers. This is due to the fact that the manufacturing cost of the particles to become an etching mask reduces as the particle diameter is reduced, and that the process time required for the dry etching step shortens as the particle diameter is reduced. It should be noted that the cost of the device for producing a relatively small uneven structure with a pitch of 1 μm or less and that of the device for producing a relatively large uneven structure with a pitch of several micrometers are equivalent.

In addition, according to the manufacturing method of the present embodiment, an uneven structure having an arrangement like a polycrystalline structure in which a macroscopic lattice orientation is random (that is, the ratio of the maximum value and the minimum value of the FFT fundamental wave is small) can be provided to the substrate $S_1$.

<Semiconductor Light Emitting Device>

A semiconductor light emitting device of the present embodiment includes a semiconductor light emitting device substrate of the present embodiment, a semiconductor functional layer laminated on the surface where the uneven structure has been formed, a p-type electrode and an n-type electrode. The semiconductor functional layer at least includes a light emitting layer.

The semiconductor functional layer is preferably composed of a group III-V nitride semiconductor group in which a group V element is nitrogen. For example, GaN, InGaN, AlGaN, InAlGaN, GaAs, AlGaAs, InGaAsP, InAlGaAsP, InP, InGaAs, InAlAs, ZnO, ZnSe, ZnS and the like can be mentioned. This is because there is a need to form a group III-V nitride semiconductor on a substrate such as sapphire.

Typical examples of group III-V nitride semiconductors include gallium nitride and indium nitride. Although aluminum nitride is strictly an insulator, in the present embodiment, in accordance with the convention in the field of the semiconductor light emitting device, it is treated as falling within the category of III-V nitride semiconductor.

The layer constitution of the semiconductor functional layer is preferably a constitution composed at least of an n-type conductive layer, a p-type conductive layer and a group III-V nitride semiconductor layer having a light emitting layer sandwiched between these layers. As the light emitting layer, a light emitting layer composed of a group III-V nitride semiconductor represented by $In_xGa_yAl_zN$ (wherein $0 \leq x \leq 1$, $0 \leq y \leq 1$, $0 \leq z \leq 1$, $x+y+z=1$) is preferred.

In the group III-V nitride semiconductor functional layer, in addition to the n-type conductive layer, the p-type conductive layer and the light emitting layer sandwiched between these layers, a monolayer or multilayer (including cases where it is a thick film layer or a superlattice thin film layer) required for making these layers a high quality crystal may also be included in some cases.

For example, there are also cases where a buffer layer is included.

In addition, each of the above-mentioned layers may also be composed of a plurality of layers, respectively.

Specific examples of the semiconductor functional layer include a multilayer film formed by sequentially laminating a buffer layer composed of GaN, AlN or the like, an n-type conductive layer (cladding layer) composed of n-GaN, n-AlGaN or the like, a light emitting layer composed of InGaN, GaN or the like, a p-type conductive layer (cladding layer) composed of undoped GaN, p-GaN or the like, and a cap layer composed of Mg-doped AlGaN, Mg-doped GaN (see, for example, Japanese Unexamined Patent Application, First Publication No. Hei 6-260682, Japanese Unexamined Patent Application, First Publication No. Hei 7-15041, Japanese Unexamined Patent Application, First Publication No. Hei 9-64419 and Japanese Unexamined Patent Application, First Publication No. Hei 9-36430).

It should be noted that as the n-type electrode and the p-type electrode for supplying electric current to the light emitting layer, it is possible to use an electrode made of a metal such as Ni, Au, Pt, Pd, Rh, Ti and Al.

Functions of the semiconductor functional layer preferably include an activity for recombining the n-type conductivity, p-type conductivity and a carrier. A laminated structure in the semiconductor functional layer may be a double heterostructure in which an active layer is sandwiched between an n-type semiconductor layer and a p-type semiconductor layer, or may be a multiple quantum well structure in which a plurality of quantum well structures are superimposed.

In the semiconductor light emitting device of the present embodiment, in order to adjust the emission wavelength, it is also possible to laminate a wavelength conversion layer for converting the wavelength of light emitted from the light emitting layer to the light extraction side of the semiconductor functional layer to the long wavelength side than the wavelength of the emitted light. For example, in the case of a top emission type device, since the light emitted by the light emitting layer is extracted from the p-type electrode side, it is possible to arrange the wavelength conversion layer between the light emitting layer and the p-type electrode. Alternatively, the wavelength converting layer may be arranged outside the p-type electrode (outside the device) (in this case, a phosphor is included in a resin embedding an LED device). Alternatively, in the case of a bottom emission type device, since the light emitted by the light emitting layer is taken out through the substrate, it is possible to arrange the wavelength conversion layer between the light emitting layer and the substrate. In addition, in those cases where the light emitted by the light emitting layer is taken out through the substrate, the wavelength conversion layer can be arranged on a surface opposite to a surface of the substrate on which the semiconductor light emitting device is provided. In this case, it is also possible to place the wavelength conversion layer by a method of including a phosphor in a resin embedding an LED device.

For example, when the emission wavelength of the light emitting layer contains a large amount of emission energy of the ultraviolet region, by including a blue phosphor that emits fluorescence with a peak wavelength of 410 nm to 483 nm, a green phosphor that emits fluorescence with a peak wavelength of 490 nm to 556 nm and a red phosphor that emits fluorescence with a peak wavelength of 585 nm to 770 nm in the wavelength conversion layer, it is possible to obtain white extracted light suitable for illumination. In addition, if the emission wavelength of the light emitting layer contains a large amount of emission energy of the blue region, by including an yellow phosphor that emits fluorescence with a peak wavelength of 570 nm to 578 nm in the wavelength conversion layer, it is possible to obtain white extracted light suitable for illumination.

<Method of Manufacturing a Semiconductor Light Emitting Device>

A method of manufacturing a semiconductor light emitting device according to the present embodiment includes a step of obtaining a light emitting device substrate by the method of manufacturing the light emitting device substrate according to the present embodiment, and a step of laminating a semiconductor function layer including at least a light emitting layer on a surface of the resulting light emitting device substrate on which an uneven structure has been formed.

[Semiconductor Functional Layer Lamination Step]

For a method of laminating a semiconductor functional layer on a semiconductor light emitting device substrate, a known epitaxial growth method such as an MOVPE (metal-organic vapor phase epitaxy) method, an MBE (molecular beam epitaxy) method and an HVPE (hydride vapor phase epitaxy) method can be used. Examples of the epitaxial growth method include a vapor phase epitaxial growth method, a liquid phase epitaxial growth method and a molecular beam epitaxial growth method. In a reactive sputtering method, a target composed of constituent elements of a compound semiconductor layer is sputtered, and a material for forming the semiconductor layer is produced by a reaction of the particles sputtered from the target with impurities in the vapor phase. A method for forming an n-type semiconductor layer may be any method as long as it is an epitaxial growth method or reactive sputtering method in which an n-type impurity is added. A method for forming a p-type semiconductor layer may be any method as long as it is an epitaxial growth method or reactive sputtering method in which a p-type impurity is added.

In the liquid phase epitaxial growth method, using a supersaturated solution containing a material for forming the compound semiconductor layer while maintaining the equilibrium of a solid phase and a liquid phase, the material for forming the compound semiconductor layer is grown as a crystal on a light emitting structure forming surface of the semiconductor light emitting device substrate. In the vapor phase epitaxial growth method, an atmosphere in which material gas flows generates a material for forming the compound semiconductor layer, and the material for forming the compound semiconductor layer is grown as a crystal on a light emitting structure forming surface. In the molecular beam epitaxial growth method, a beam of molecules or atoms composed of a constituent element of the compound semiconductor layer is irradiated onto a light emitting structure forming surface, thereby growing a material for forming the compound semiconductor layer as a crystal on the light emitting structure forming surface. Among these, the halide vapor phase epitaxy method using a hydride such as $AsH_3$ and $PH_3$ as a group V raw material is preferred in terms of a large thickness of the growing compound semiconductor layer.

As a group III material, for example, trialkyl gallium represented by a general formula $R_1R_2R_3Ga$ (here, $R_1$, $R_2$ and $R_3$ represent a lower alkyl group) such as trimethyl gallium [$(CH_3)_3Ga$, hereinafter sometimes referred to as TMG] and triethyl gallium [$(C_2H_5)_3Ga$, hereinafter sometimes referred to as TEG], trialkyl aluminum represented by a general formula $R_1R_2R_3Al$ (here, $R_1$, $R_2$ and $R_3$ represent a lower alkyl group) such as trimethylaluminum [$(CH_3)_3Al$, hereinafter sometimes referred to as TMA], triethylaluminum [$(C_2H_5)_3Al$, hereinafter sometimes referred to as TEA] and triisobutyl aluminum [$(i-C_4H_9)_3Al$], trimethylamine alane [$(CH_3)_3N:AlH_3$], trialkyl indium represented by a general formula $R_1R_2R_3In$ (here, $R_1$, $R_2$ and $R_3$ represent a lower alkyl group) such as trimethylindium [$(CH_3)_3In$, hereinafter sometimes referred to as TMI] and triethyl indium [$(C_2H_5)_3In$]), those obtained by substituting one or two alkyl groups from trialkyl indium with a halogen atom, such as diethyl indium chloride [$(C_2H_5)_2InCl$], and halogenated indium represented by a general formula $InX_3$ (X represents a halogen atom) such as indium chloride [$InCl_3$] and the like can be mentioned. These may be used alone or may be used as a mixture.

As a group V material, for example ammonia, hydrazine, methylhydrazine, 1,1-dimethylhydrazine, 1,2-dimethylhydrazine, t-butylamine, ethylenediamine and the like can be mentioned. These can be used alone or as a mixture in any combination. Among these materials, ammonia and hydrazine are preferred since they do not contain carbon atoms within the molecule and the level of carbon contamination into the semiconductor is low.

In the MOVPE method, as an atmospheric gas and a carrier gas of an organometallic material during growth, a gas such as nitrogen, hydrogen, argon and helium can be used alone or as a mixture, and hydrogen and helium are preferred.

According to the present embodiment, the uneven structure of the substrate has moderate randomness. Therefore, it is possible to obtain a semiconductor light emitting device with which a sufficient light extraction efficiency is obtained while the problem of increases in the color shift and in-plane anisotropy is prevented. In addition, since a semiconductor is laminated on a substrate in which a flat surface is formed between the convex portions, it is possible to stably grow a semiconductor layer on the flat surface. Therefore, the crystal defects in the semiconductor layer are less likely to occur.

Second Embodiment

With reference to FIG. 6 to FIG. 13, a semiconductor light emitting device substrate, a semiconductor light emitting device, a method of manufacturing a semiconductor light emitting device substrate, and a method of manufacturing a semiconductor light emitting device according to the present embodiment will be described.

[Semiconductor Light Emitting Device Substrate]

Figure 6:
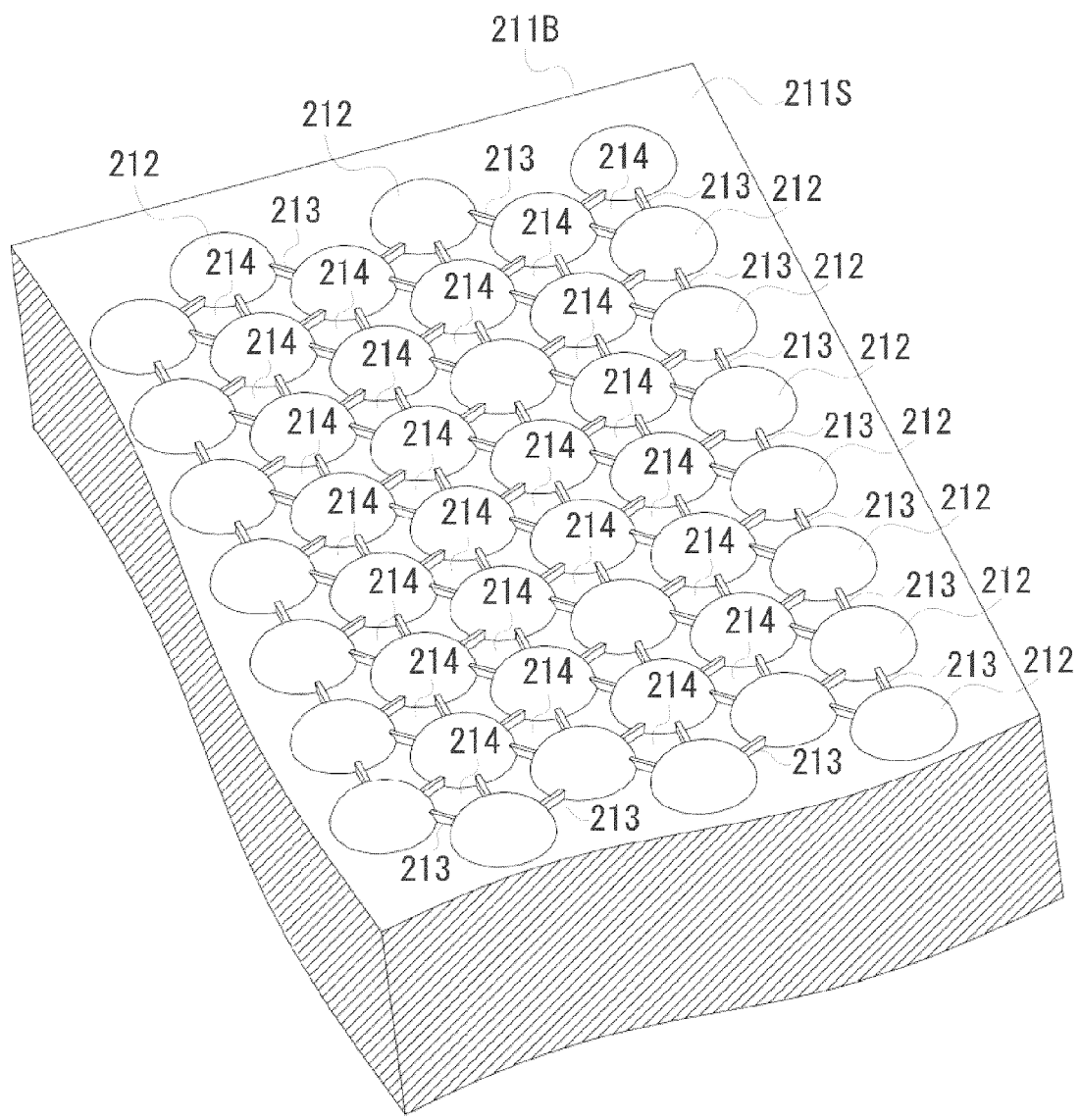
FIG. 6 is a partial perspective view showing an enlarged portion of a semiconductor light emitting device substrate according to an embodiment in a technique of the present disclosure.

As shown in FIG. 6, a semiconductor light emitting device substrate (hereinafter, referred to as a device substrate 211B) includes, as one side surface, a light emitting structure forming surface 211S. In the manufacturing process of the semiconductor light emitting device, a light emitting structure is formed on the light emitting structure forming surface 211S.

As a material for forming the device substrate 211B, the material of the substrate described in the first embodiment can be used. The light emitting structure forming surface 211S has crystallinity in itself which is suitable for providing crystallinity to the light emitting structure.

The light emitting structure forming surface 211S includes an uneven structure constituted of a large number of fine irregularities. Fine irregularities are repeated in the direction along which the light emitting structure forming face 211S spreads. The uneven structure included in the light emitting structure forming surface 211S is constituted of a large number of convex portions 212, a large number of bridge portions 213 and a large number of flat portions 214.

Each of the number of flat portions 214 is a flat surface being extended along one crystal plane, and is arranged on one plane. When the crystal system of the device substrate 211B is hexagonal, the flat portion 214 is, for example, a flat surface obtained by continuation of a single plane selected from the group consisting of a c-plane, m-plane, a-plane and r-plane. When the crystal system of the device substrate 211B is cubic, the flat portion 214 is, for example, a flat surface obtained by continuation of a single plane selected from the group consisting of a (001) plane, (111) plane and (110) plane. It should be noted that the crystal plane included in the flat portion 214 may be a higher index plane than the index plane described above, as long as it is a single crystal plane suitable for providing crystallinity to the light emitting structure. The crystal plane included in each of the plurality of flat portions 214 facilitate provision of crystallinity to the semiconductor layer on the light emitting structure forming surface 211S.

[Protrusion 12]

Each of the numerous convex portions 212 protrudes from the flat portion 214 connected to the convex portion 212, and also has a shape that gets narrower from the base end to be connected to the flat portion 214 toward the apex. Each of the plurality of convex portions 212 has a hemispherical shape.

It should be noted that the shape of the convex portions 212 is not limited to the hemispherical shape, and it may be a conical shape or may be a pyramid shape. In addition, bus that passes through the apex of the convex portion 212 and appears when the convex portion 212 is cut by a plane perpendicular to the light emitting structure forming surface 211S in the cross-section thereof may be a curve. The shape of the convex portion 212 may be a multistage shape that gets narrower from the base end toward the apex, and may even be shape that gets thick once on the way from the base end to the apex. The shapes of each of a large number of convex portions 212 may be different from each other.

An interval between the convex portions 212 adjacent to each other is a pitch of the convex portion 212. The pitch of the convex portions 212 may be the same as that of the first embodiment. As one aspect, the most frequent value of the pitch is preferably equal to or more than 100 nm and equal to or less than 5 μm. If the pitch of the convex portion 212 is equal to or more than 100 nm and equal to or less than 5 μm, to an extent so that the total reflection of light at the light emitting structure forming surface 211S is suppressed, on the light emitting structure forming surface 211S, the convex portions 212 are formed in the arrangement and density required therefor. In this case, the balance between the convex portion 212 and the flat portion 214 is appropriately designed. In addition, if the most frequent value of the pitch of the convex portion 212 is 5 µm or less, visibility of a large number of protrusions 212 is sufficiently suppressed, and an unnecessary increase in the thickness of the device substrate 211B is also suppressed.

The most frequent value of the pitch can be obtained by the method of determining the most frequent pitch P described in the first embodiment. For example, as shown below, it can be determined by image processing based on the AFM image. First, for a rectangular region selected arbitrarily in the light emitting structure forming surface 211S, an AFM image is obtained. At this time, in the rectangular region from which the AFM image is obtained, the length of one side of the rectangular region is 30 to 40 times as long as the most frequent value of the pitch. Next, by the waveform separation of the AFM image using a Fourier transform, a fast Fourier transform image based on the AFM image is obtained. Then, the distance between the zero-order peak and the primary peak in the fast Fourier transformed image is obtained, and the reciprocal of the distance is treated as a pitch of the convex portion 212 in one rectangular region. Then, the pitch is measured for the rectangular regions in 25 or more locations that are different from each other, and an average value of the thus obtained measured value is a most frequent value of the pitch of the convex portion 212. It should be noted that the rectangular regions are preferably separated from each other by at least 1 mm, and more preferably separated by 5 mm to 1 cm.

The height from the flat portion 214 in each of a large number of convex portions 212 may be the same as that of the first embodiment. As one aspect, the height from the flat portion 214 in each of a large number of convex portions 212 is preferably equal to or more than 50 nm and equal to or less than 300 nm. If the height of the plurality of convex portions 212 is equal to or more than 50 nm and equal to or less than 300 nm, the total reflection of light in the light emitting structure forming surface 211S is easily suppressed. If the height of the convex portion 212 is equal to or more than 50 nm and equal to or less than 300 nm, in a semiconductor layer to be formed on the light emitting structure formed surface 211S, the occurrence of deposition defects caused by the formation of the convex portion 212 is suppressed.

The most frequent value of the height of the convex portion 212 is determined, for example, as shown below, by image processing based on the AFM image. First, for a rectangular region selected arbitrarily in the light emitting structure forming surface 211S, an AFM image is obtained, and from the AFM image, a cross-sectional shape of an uneven structure is obtained. Next, for five or more convex portions 212 that are arranged in series in the cross-sectional shape, the difference between the height of the vertex in the convex portion 212 and the height of the flat portion 214 connected to the convex portion 212 is measured. Then, the height of the convex portion 212 is also measured in the same manner for the rectangular regions in 5 or more locations that are different from each other, and the height of 25 or more convex portions 212 is measured in total. It should be noted that the rectangular regions are preferably separated from each other by at least 1 mm, and more preferably separated by 5 mm to 1 cm. Then, a profile in the equatorial direction using a two-dimensional Fourier transform image is created, and the most frequent value of the height of the convex portion 212 is obtained from the reciprocal of the primary peak thereof.

[Bridge Portion 213]

In the present embodiment, a bridge portion can be configured in a manner so as to connect the adjacent convex portions 212 with each other. Although it is possible to obtain the optical effects and the effect of mechanical strength to be described later by providing the bridge portion, even if the bridge portion is not provided, since the range of the flat portion 214 is expanded by the particle size reduction of the mask particles, it is possible to effectively carry out an epitaxial growth in the LED forming step afterwards.

Each of a large number of the bridge portions 213 protrudes from a flat portion 214 to be connected to the bridge portion 213, and also links between the convex portions 212 that are adjacent to each other. The height of each of a large number of the bridge portions 213 is lower than the height of the convex portion 212, and also has a ridge shape that connects the centers of the convex portions 212 having a hemispherical shape. It should be noted that the shape of the bridge portion 213 is not limited to a linear shape, and may be a curved shape or a broken line shape. The shape of each of a large number of the bridge portions 213 may be different from each other. The bridge portion 213 includes a top surface 213T. The top surface 213T includes a flat surface.

The length along the longitudinal direction of the bridge portion 213 is preferably equal to or more than 50 nm and equal to or less than 300 nm. If the length along the longitudinal direction of the bridge portion 213 is equal to or more than 50 nm and equal to or less than 300 nm, the total reflection of light at the light emitting structure forming surface 211S is easily suppressed. The length along the transverse direction of the bridge portion 213 is preferably equal to or more than 10 nm and equal to or less than 100 nm. If the length along the transverse direction of the bridge portion 213 is equal to or more than 10 nm and equal to or less than 100 nm, the total reflection of light at the light emitting structure forming surface 211S is easily suppressed. In addition, the mechanical strength of the bridge portion 213 is secured to an extent so as to sufficiently endure the film stress of the light emitting structure.

Figure 7:
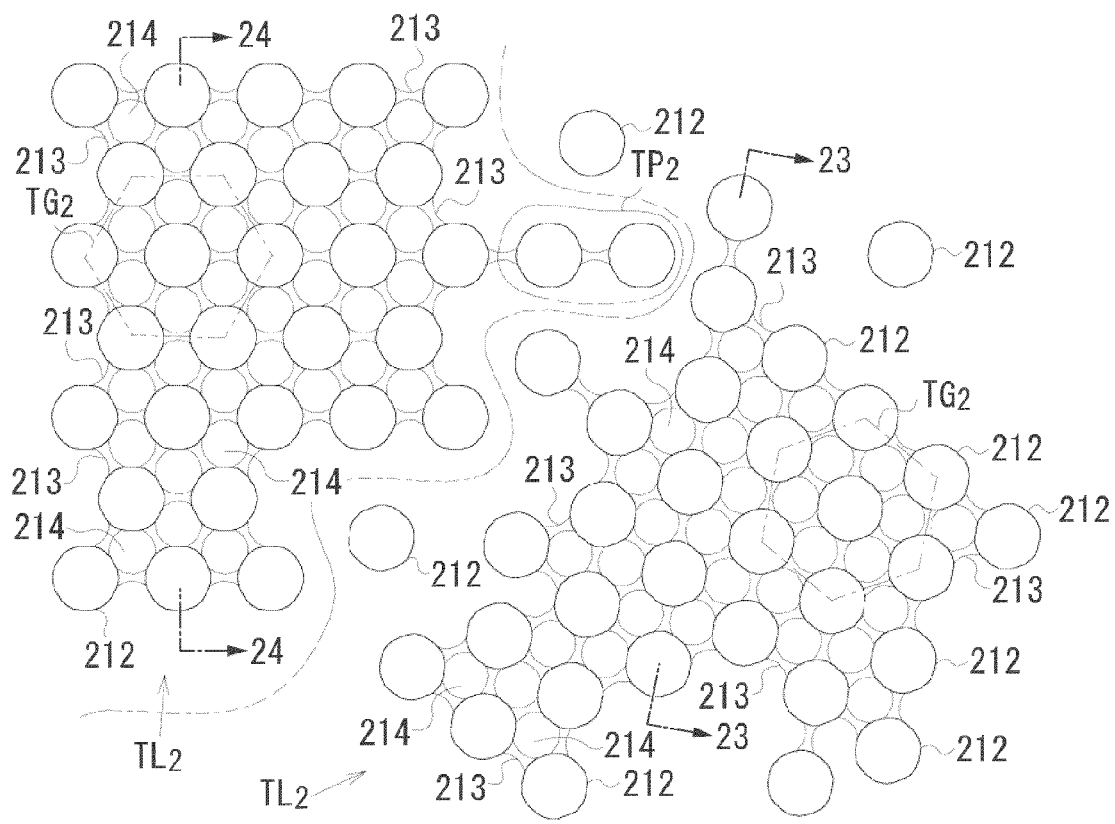
FIG. 7 is a partial plan view showing an enlarged portion of a planar structure of a semiconductor light emitting device substrate according to an embodiment.

As shown in FIG. 7, in plan view of the light emitting structure forming surface 211S, a plurality of convex portions 212 include a plurality of convex portion pairs TP2. One convex portion pair TP2 is constituted of two convex portions 212 that are adjacent to each other, and the two convex portions 212 included in one convex portion pair TP2 are connected by a single bridge portion 213. In the light emitting structure forming surface 211S, one flat portion 214 is surrounded by three convex portion pairs TP2.

A plurality of convex portions 212 include a plurality of convex portion groups TG2. One convex portion group TG2 is constituted of six convex portion pairs TP2. In one convex portion group TG2, one of the convex portions 212 in the six convex portion pairs TP2 is common with each other. Seven convex portions 212 that constitute one convex portion group TG2 have a hexagonal packing structure. In the convex portion group TG2, 6 convex portions 212 are arranged at six vertices of a hexagonal shape and one convex portion 212 is also placed at a portion surrounded by the six convex portions 212. That is, in each of the plurality of convex portion groups TG2, in the periphery of one convex portion 212 to become the center, six convex portions 212 are arranged equally. Then, from the one convex portion 212 which is the center toward the other convex portions 212, six bridge portions 213 are extended radially. In one convex portion group TG2, the height of each of the six bridge portions 213 tends to be low as the interval between the convex portions 212 that are connected by the bridge portion 213 increases.

If the light emitting structure forming surface 211S is configured so as to include a plurality of convex portion groups TG2, the effect of suppressing the total reflection by the convex portion 212 is enhanced. Further, concentration of the film stress of the light emitting structure to be formed on the light emitting structure forming surface 211S on one convex portion 212 can also be suppressed. In addition, the mechanical strength required for the convex portion 212 can also be suppressed.

A plurality of convex portions 212 include a plurality of convex portion teams TL2. Each of the plurality of convex portion teams TL2 is constituted of two or more convex portion groups TG2. In each of the plurality of convex portion teams TL2, two convex portion groups TG2 that are different from each other share two or more convex portions 212 with each other. In each of the plurality of convex portion teams TL2, any one of, preferably any two of, and more preferably all of a direction in which the convex portion groups TG2 are aligned, an area occupied by one convex portion team TL2 and a shape of one convex portion team TL2 are different from each other. That is, in the light emitting structure forming surface 211S, each of the plurality of convex portion teams TL2 is arranged at random including the size and shape thereof. In one convex portion team TL2, the height of each of the plurality of bridge portions 213 preferably gets low, as the interval between the convex portions 212 that are connected by the bridge portion 213 increases.

If the light emitting structure forming surface 211S is configured so as to include a plurality of convex portion teams TL2, a fine uneven structure has a moderate randomness to an extent so that the refraction of light entering the light emitting structure forming surface 211S is averaged inside the light emitting structure forming surface 211S. Therefore, the effect of suppressing the total reflection is averaged by the light emitting structure forming surface 211S. In addition, since one bridge portion 213 is formed for each one of the convex portion pairs TP2, the effect of suppressing the total reflection is further enhanced. Furthermore, while a large number of such bridge portions 213 are formed, one flat portion 214 is surrounded by three bridge portions 213. For this reason, unevenly high distribution of the bridge portion 213 in one place is suppressed, and extremely low distribution of the flat portion 214 in one place can also be suppressed. As a result, it is possible to suppress the crystallinity of the light emitting structure being extremely inferior in one place, and the total reflection at the light emitting structure forming surface 211S can also be suppressed.

It should be noted that the light emitting structure forming surface 211S may have an isolated convex portion group TG2 or may have an isolated convex portion 212, in addition to the plurality of convex portion teams TL2. Further, each of the plurality of convex portion teams TL2 may have the same size as each other, and may have the same shape as each other. In addition, each of the plurality of convex portion teams TL2 may be configured so that the directions in which the convex portion groups TG2 are aligned are the same with each other, as long as they are configured to be separated from each other.

Figure 8:
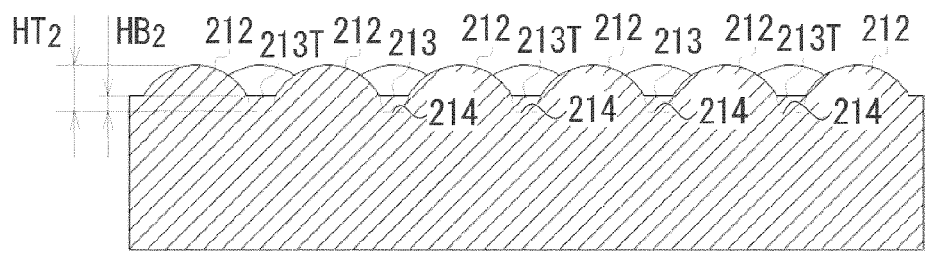
FIG. 8 is a partial cross-sectional view showing a portion of a cross-sectional structure of a semiconductor light emitting device substrate according to an embodiment, and is a partial cross-sectional view as seen from a line 23-23 in FIG. 7.

As shown in FIG. 8, the height of the vertex of the convex portion 212 with respect to the flat portion 214 is a convex portion height $HT_2$. In addition, the height of a top surface 213T of the bridge portion 213 with respect to the flat portion 214 is a bridge height $HB_2$. In those cases where the bridge portions are actively provided, it is preferable that the bridge height $HB_2$ be lower than the convex portion height $HT_2$, and lower than half of the convex portion height $HT_2$. More specifically, a ratio $HB_2/HT_2$ is preferably in the range of 0.01 to 0.40, and more preferably in the range of 0.05 to 0.20. The bridge height $HB_2$ is preferably constant over substantially the whole of the bridge portion 213 along the direction in which the bridge portion 213 extends.

Figure 9:
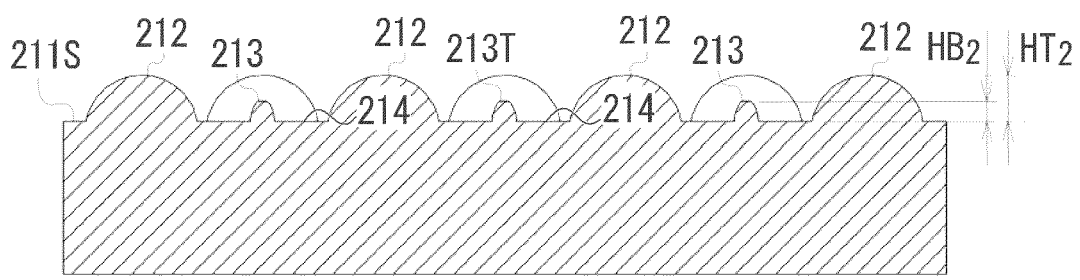
FIG. 9 is a partial cross-sectional view showing a portion of a cross-sectional structure of a semiconductor light emitting device substrate according to an embodiment, and is a partial cross-sectional view as seen from a line 24-24 in FIG. 7.

As shown in FIG. 9, the bridge height $HB_2$ is also constant along a direction that intersects with the direction in which the bridge portion 213 extends. The top surface 213T of the bridge portion 213 includes a flat surface. The flat surface extends along the direction in which the bridge portion 213 extends and also continues along the direction that intersects with the direction in which the bridge portion 213 extends. The top surface 213T of the bridge portion 213 includes a flat surface extending along one crystal plane, as the flat portion 214.

When the crystal system of the device substrate 211B is hexagonal, the top surface 213T of the bridge portion 213 is, as the flat portion 214, for example, a flat surface obtained by continuation of a single plane selected from the group consisting of a c-plane, m-plane, a-plane and r-plane. When the crystal system of the device substrate 211B is cubic, the top surface 213T of the bridge portion 213 is, also as the flat portion 214, for example, a flat surface obtained by continuation of a single plane selected from the group consisting of a (001) plane, (111) plane and (110) plane.

If the top surface 213T of the bridge portion 213 is configured so as to have the crystal plane as described above, in addition to the flat portion 214, also in the top surface 213T of the bridge portion 213, provision of crystallinity to the semiconductor layer is facilitated. For this reason, even when it is configured so that a portion of the flat portion 214 is used as the bridge portion 213, it is possible to suppress reduction in the crystallinity of the semiconductor layer due to this.

[Method of Manufacturing the Device Substrate 211B]

A method of manufacturing a semiconductor light emitting device substrate includes: a particle arranging step for arranging a plurality of particles on a substrate; a particle etching step (etching step of monolayer particle film $F_1$) for dry etching the aforementioned plurality of particles arranged to provide a void between the particles in a condition by which the aforementioned particles are etched while the aforementioned substrate is not etched substantially; and a substrate etching step (etching step of light emitting structure forming surface 11S) for dry etching the aforementioned substrate by using the plurality of particles after the aforementioned particle etching step as an etching mask, thereby forming an uneven structure on one surface of the aforementioned substrate. Hereinafter, each step included in the method of manufacturing a semiconductor light emitting device substrate will be described in the order of treatment, although for the particle arranging step, because it can be carried out by the same method as in the first embodiment, the description thereof will be omitted.

[Etching Step of Monolayer Particle Film $F_1$]

An etching step of a monolayer particle film $F_1$ can be carried out basically by the same method as in the first embodiment.

Figure 10:
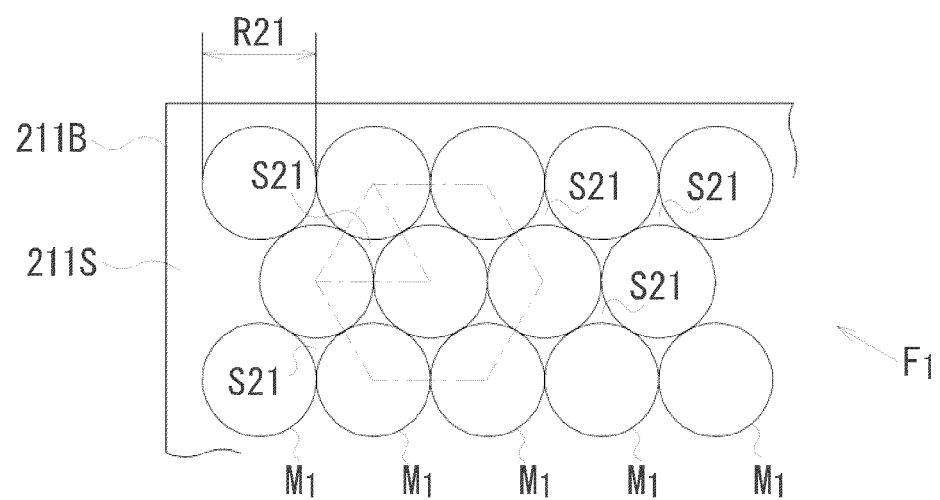
FIG. 10 is a partial plan view showing a portion of a planar structure of a monolayer particle film formed in a step of forming a monolayer particle film in a method of manufacturing a semiconductor light emitting device substrate according to an embodiment.

As one aspect, as shown in FIG. 10, the monolayer particle film $F_1$ constituted of particles $M_1$ of a monolayer is formed on the light emitting structure forming surface 211S. The monolayer particle film $F_1$ has a hexagonal packing structure of the particles $M_1$ having a diameter R21. One hexagonal packing structure is formed of seven particles $M_1$. In the hexagonal packing structure, six particles $M_1$ are arranged at six vertices of a hexagonal shape, and one particle $M_1$ is filled in a portion surrounded by the six particles $M_1$. That is, in one hexagonal packing structure, in the periphery of one particle $M_1$ to become the center, six particles $M_1$ are arranged equally.

The hexagonal packing structure includes three particles $M_1$ arranged at three vertices of a triangle. A region surrounded by three particles $M_1$ when viewed from the normal direction of the substrate is a minimum void in the monolayer particle film $F_1$. When viewed from the normal direction of the substrate, the light emitting structure forming surface 211S has a first exposed portion S21 exposed to the outside through this minimum void.

Figure 11:
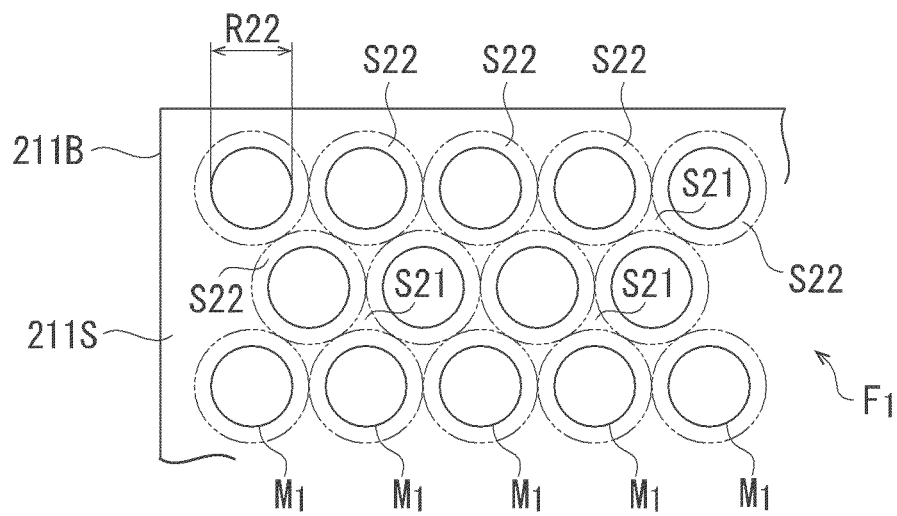
FIG. 11 is a partial plan view showing a portion of a planar structure of a monolayer particle film etched in a step of etching a monolayer particle film in a method of manufacturing a semiconductor light emitting device substrate according to an embodiment.

As shown in FIG. 11, in the monolayer particle film etching step, the particles $M_1$ constituting the monolayer particle film $F_1$ are etched under etching conditions by which the device substrate 211B is not substantially etched. At this time, the particle size of the particles $M_1$ constituting the monolayer particle film $F_1$ is reduced to a diameter R22 by selective etching. By the reduction of particles $M_1$ in size, between the particles $M_1$ that are adjacent to each other, a new void is formed. The light emitting structure forming surface 211S has a second exposed portion S22 exposed to the outside through this new void. That is, by newly forming the second exposed surface S22 in the periphery of the first exposed surface S21, the first exposed surface S21 becomes a single continuous exposed surface. It should be noted that the light emitting structure forming surface 211S is not substantially etched, and keeps the same state as before the reduction of particle size of the particles $M_1$.

In the etching conditions by which the light emitting structure forming surface 211S is not substantially etched, the ratio of the etching rate of the light emitting structure forming surface 211S with respect to the etching rate of the particles $M_1$ is preferably 25% or less. The ratio of the etching rate of the light emitting structure forming surface 211S with respect to the etching rate of the particles $M_1$ is more preferably 15% or less, and particularly preferably 10% or less. It should be noted that for such etching conditions, the etching gas used in the reactive etching may be selected appropriately. For example, when the device substrate 211B is sapphire and the particles $M_1$ are silica, one or more gases selected from the group consisting of $CF_4$, $SF_6$, $CHF_3$, $C_2F_6$, $C_3F_8$, $CH_2F_2$, $O_2$ and $NF_3$ may be used as an etching gas.

[Etching Step of Light Emitting Structure Forming Surface 211S]

Figure 12:
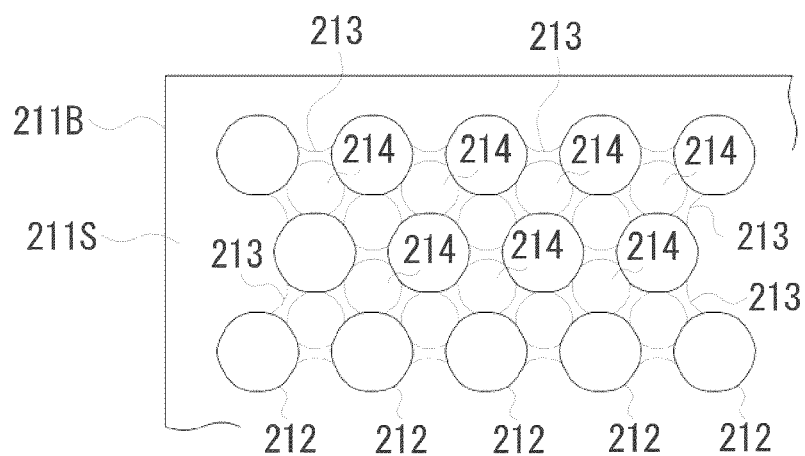
FIG. 12 is a partial plan view showing a portion of a planar structure of a light emitting structure forming surface etched in a step of etching a light emitting structure forming surface in a method of manufacturing a semiconductor light emitting device substrate according to an embodiment.

As shown in FIG. 12, in the etching step, the light emitting structure forming surface 211S is etched by using the particles $M_1$ with a reduced diameter as a mask. At this time, in the light emitting structure forming surface 211S, the first exposed portion S21 is exposed to a plasma of the etching gas through a void surrounded by three particles $M_1$ that are adjacent to each other. In the light emitting structure forming surface 211S, the second exposed portion S22 is exposed to the plasma of the etching gas through a void between the two particles $M_1$ that are adjacent to each other. Then, the particles $M_1$ constituting a monolayer particle film are also exposed to the plasma of the etching gas.

Here, a first region 214 that combines the first exposed portion S21 and the second exposed portion S22 located in the periphery of the first exposed portion S21 has a larger area than a second region 213 that adds together the second exposed portions S22 that are voids between the two particles $M_1$ that are adjacent to each other. Therefore, the etching rate of the first region 214 is greater than the etching rate of the second region 213. For this reason, in the light emitting structure forming surface 211S, the etching of the first region 214 advances faster than the etching of the second region 213. In addition, in the light emitting structure forming surface 211S, the etching of the second region 213 advances faster than the etching of a portion covered with the particles $M_1$. Further, among a plurality of first regions 214, the etching rate in the first region 214 increases as the size of the first region 214 increases. In addition, among a plurality of second regions 213, the etching rate in the second region 213 increases as the size of the second region 213 increases.

As a result, in the light emitting structure forming surface 211S, a flat portion 214 is formed in the first region 214 as a deep recessed portion. In addition, as a recessed portion shallower than the flat portion 214, a bridge portion 213 is formed in the second region 213. Further, as a portion other than the flat portion 214 and the bridge portion 213, a convex portion 212 having a hemispherical shape is formed. Among a plurality of bridge portions 213, the larger the distance between the convex portions 212 that are connected by the bridge portion 213, the height of the bridge portion 213 is lowered. When the bridge portions are actively produced, for example, in the case of a combination of the silica particle mask and the sapphire substrate, the interval between the convex portions 212 becomes 300 nm to 700 nm when the most frequent pitch is 3.0 μm, and the height of the bridge in that case is 10 to 300 nm. In addition, the interval between the convex portions 212 becomes 10 nm to 100 nm when the most frequent pitch is 400 nm, and the height of the bridge in that case is 5 nm to 100 nm. In addition, since the spacing between the convex portions 212 and the height of the bridge change by dry etching conditions including combinations of the material of the particle mask and the material of the substrate and the selection of gas, the above values vary depending on the conditions.

It should be noted that when the size of the second exposed portion S22 is changed in the etching step of the monolayer particle film $F_1$ described above, in the subsequent etching step of the light emitting structure forming surface 211S, the height of the bridge portion 213 to be finally formed changes. For the method of changing the height of the bridge portion 213, in addition to the etching step of the monolayer particle film $F_1$, a change in the etching gas used in etching of the light emitting structure forming surface 211S can be mentioned.

For example, a gas that increases the etching rate of the monolayer particle film $F_1$ while decreasing the etching rate of the device substrate 211B is used for the etching step of the light emitting structure forming surface 211S. At this time, the etching rate of the particles $M_1$ is further reduced with respect to the light emitting structure forming surface 211S, and the rate of expansion of the second exposed portion S22 is also further reduced. Eventually, a large difference occurs between the degree of progress of etching in the first exposed portion S221 and the degree of progress of etching in the second exposed portion S22, and, as a result, the height of the bridge portion 213 is increased.

On the other hand, a gas that decreases the etching rate of the monolayer particle film $F_1$ while increasing the etching rate of the device substrate 211B is used for an etching gas of the light emitting structure forming surface 211S. At this time, the etching rate of the particles $M_1$ becomes close with respect to the light emitting structure forming surface 211S, and the rate of expansion of the second exposed portion S22 is further increased. Eventually, a difference between the degree of progress of etching in the first exposed portion S221 and the degree of progress of etching in the second exposed portion S22 becomes small, and, as a result, the height of the bridge portion 213 is lowered. It should be noted that the gas used at this time may be composed of one type of gas, or may be composed of two or more types of gases.

Furthermore, in the etching step of the monolayer particle film $F_1$ described above, a change in the height of the bridge portion 213 may be combined with the change in the height of the bridge portion 213 due to the change in the etching gas as described above.

It should be noted that even if the bridge portions are not actively produced (even if the height of the bridge portion corresponds to virtually zero), by the effect of extending the interval between the convex portions 212 due to the reduction in the particle size of the mask as described above, it is possible to secure more area of the flat portion required in the LED deposition step, and more efficient epitaxial crystal growth with less crystal defects can be achieved. Therefore, as a result, a benefit of improving the emission efficiency of the semiconductor light emitting device fabricated by depositing a semiconductor layer on such a substrate can be attained.

The pitch of the convex portion 212 is equivalent to the spacing between the particles $M_1$ that are adjacent to each other, and the arrangement of the convex portion 212 is also similar to the arrangement of the particles $M_1$. In addition, the arrangement of the bridge portion 213 is on a line connecting the centers of the particles $M_1$ that are adjacent to each other, and the shape of the bridge portion 213 is a linear shape connecting the centers of the particles $M_1$ that are adjacent to each other. Further, of the light emitting structure forming surface 211S, a convex portion team TL2 is formed in a portion where the film elements of the monolayer particle film are stacked, and a convex portion group TG2 is formed in a portion where the hexagonal packing structures of the particles $M_1$ are stacked.

In the etching step, the etching rate of the light emitting structure forming surface 211S is preferably higher than the etching rate of the particles $M_1$. The ratio of the etching rate of the light emitting structure forming surface 211S with respect to the etching rate of the particles $M_1$ is preferably at least 200%, and more preferably 300% or less. It should be noted that for such etching conditions, the etching gas used in the reactive etching may be selected appropriately. For example, when the device substrate 211B is sapphire and the particles $M_1$ are silica, one or more gases selected from the group consisting of $Cl_2$, $BCl_3$, $SiCl_4$, HBr, HI and HCl may be used as an etching gas.

[Semiconductor Light Emitting Device]

Figure 13:
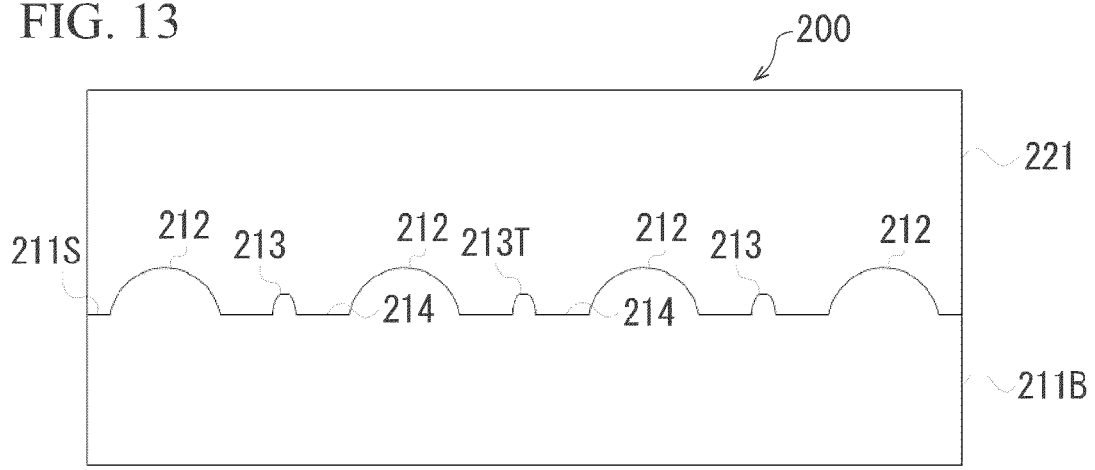
FIG. 13 is a partial cross-sectional view schematically showing a portion of a cross-sectional structure of a semiconductor light emitting device according to an embodiment.

As shown in FIG. 13, a semiconductor light emitting device 200 includes a device substrate 211B as a base material. The semiconductor light emitting device 200 includes, in the light emitting structure forming surface 211S of the device substrate 211B, a light emitting structure 221 that covers an uneven structure of the light emitting structure forming surface 211S. The light emitting structure 221 includes a laminated body constituted of a plurality of semiconductor layers and emits light by recombining carriers by the supply of electric current. Each of the plurality of semiconductor layers is laminated sequentially from the light emitting structure forming surface 211S.

The semiconductor light emitting device 200 can employ the same configuration as that of the semiconductor light emitting device described in the first embodiment. In addition, the semiconductor light emitting device 200 can be formed by the method described in the first embodiment.

According to the present embodiment, the following effects can be obtained.

(1) The total reflection by the light emitting structure forming surface 211S can be suppressed by the geometric optical effects (reflection and refraction) in the bridge portion 213. For this reason, the efficiency of extracting light generated by the light emitting structure 221 can be enhanced.

(2) Since a plurality of bridge portions 213 are connected to one convex portion 212, as compared with a configuration in which one bridge portion 213 is connected to one convex portion 212, the effect in accordance with the above effect (1) can be further enhanced.

(3) Since a convex portion group TG2 has a hexagonal packing structure and the bridge portions 213 is connected to each of the convex portions 212 constituting the hexagonal packing structure, the effect in accordance with the above effect (1) can be further enhanced.

(4) Since the arrangement of the convex portion 212 has a randomness, in the plane of the light emitting structure forming surface 211S, the uniformity of the effect in accordance with the above effect (1) can be enhanced.

(5) Since the top surface 213T of the bridge portion 213 is a crystal plane, the lack of growth of the semiconductor layer due to the formation of the convex portion 212 can be suppressed.

(6) By etching for widening the void between the particles $M_1$ that are adjacent to each other, the second exposed portion S22 for forming the bridge portion 213 is formed. For this reason, one monolayer particle film $F_1$ functions as a mask for forming the convex portion 212 and the flat portion 214, and as a mask for forming the bridge portion 213. As a result, compared to a method that requires the mask for forming the convex portion 212 and the mask for forming the bridge portion 213 separately, the number of steps required for the manufacture of the device substrate 211B is reduced.

It should be noted that the present embodiment can also be modified and implemented as follows.

The monolayer particle film $F_1$ may include, in advance, before being transferred to the light emitting structure forming surface 211S, a void for partitioning the first exposed portion S221 and a void for forming the second exposed portion S22. In accordance with such a configuration, a step of selectively etching the monolayer particle film $F_1$ will be omitted.

Figure 14:
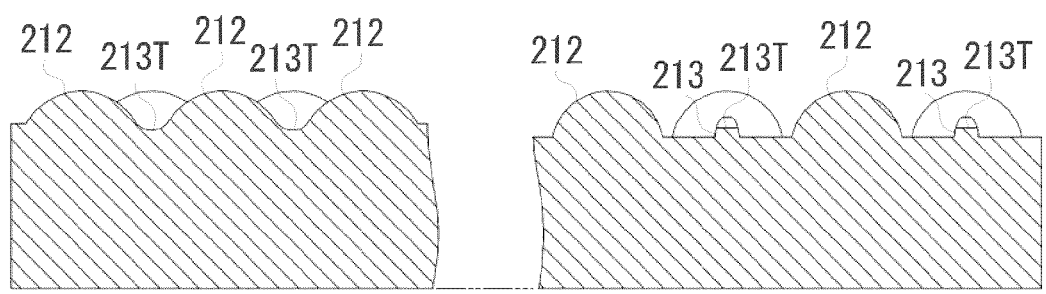
FIG. 14 is a partial perspective view showing an enlarged portion of a cross-sectional structure of a semiconductor light emitting device substrate in a semiconductor light emitting device substrate of a modified example in a technique of the present disclosure, and one on the left side is a view corresponding to FIG. 8 which will be described in an embodiment, while one on the right side is a view corresponding to FIG. 9 which will be described in an embodiment.

As shown on the left side of FIG. 14, the top surface 213T of the bridge portion 213 may be a concave surface recessed toward the flat portion 214, as viewed from a direction that intersects with the direction to which the bridge portion 213 connects. In short, the bridge portion 213 may be a portion having a lower height than the height of the convex portion 212 and connecting portions of the convex portions 212 that are adjacent to each other.

Figure 15:
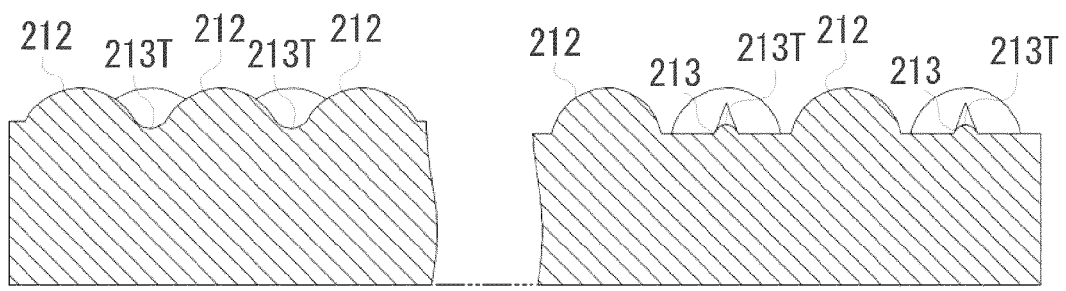
FIG. 15 is a partial perspective view showing an enlarged portion of a cross-sectional structure of a semiconductor light emitting device substrate in a semiconductor light emitting device substrate of a modified example in a technique of the present disclosure, and one on the left side is a view corresponding to FIG. 8 which will be described in an embodiment, while one on the right side is a view corresponding to FIG. 9 which will be described in an embodiment.

As shown on the left side of FIG. 15, the top surface 213T of the bridge portion 213 may be a concave surface recessed toward the flat portion 214, as viewed from a direction that intersects with the direction to which the bridge portion 213 connects, and, as shown on the right side of FIG. 15, may also be a convex surface protruding from the flat portion 214, as viewed from a direction in which the bridge portion 213 continues. In short, the top surface 213T of the bridge portion 213 may not be a crystal plane.

The flat portion 214 may be surrounded by four or more convex portion pairs TP2. Furthermore, the flat portion 214 may not be surrounded by the convex portion pair TP2. For example, in the direction that intersects with the direction to which the bridge portion 213 connects, it may have a structure in which two flat portions 214 sandwich one bridge portion 213.

In a convex portion pair TP2 in which the intervals between the convex portions 212 that are adjacent to each other are different from each other, the height of the bridge portion 213 may be equal to each other.

The semiconductor light emitting device substrate of the present embodiment includes a light emitting structure forming surface on which a light emitting structure including a semiconductor layer is formed, the aforementioned light emitting structure forming surface includes a flat portion that spreads along one crystal plane, two convex portions that are protruded from the aforementioned flat portion and one bridge portion that is protruded from the aforementioned flat portion, the amount that protrudes from the aforementioned flat portion is smaller in the bridge portion than in the aforementioned convex portion, the aforementioned two convex portions are connected by the aforementioned one bridge portion, the most frequent pitch of the aforementioned convex portion is equal to or more than 100 nm and equal to or less than 5 μm, and the aspect ratio of the aforementioned large number of the convex portions may be from 0.5 to 1.0.

The semiconductor light emitting device substrate of the present embodiment includes a light emitting structure forming surface on which a light emitting structure including a semiconductor layer is formed, the aforementioned light emitting structure forming surface includes a flat portion that spreads along one crystal plane, two convex portions that are protruded from the aforementioned flat portion and one bridge portion that is protruded from the aforementioned flat portion, the amount that protrudes from the aforementioned flat portion is smaller in the bridge portion than in the aforementioned convex portion, the aforementioned two convex portions are connected by the aforementioned one bridge portion, the most frequent pitch of the aforementioned convex portion is equal to or more than 100 nm and equal to or less than 1 μm, and the aspect ratio of the aforementioned large number of the convex portions may be from 0.5 to 1.0.

The semiconductor light emitting device substrate of the present embodiment includes a light emitting structure forming surface on which a light emitting structure including a semiconductor layer is formed, the aforementioned light emitting structure forming surface includes a flat portion that spreads along one crystal plane, two convex portions that are protruded from the aforementioned flat portion and one bridge portion that is protruded from the aforementioned flat portion, the amount that protrudes from the aforementioned flat portion is smaller in the bridge portion than in the aforementioned convex portion, the aforementioned two convex portions are connected by the aforementioned one bridge portion, the most frequent pitch of the aforementioned convex portion is from 200 nm to 700 nm, and the aspect ratio of the aforementioned large number of the convex portions may be from 0.5 to 1.0.

The semiconductor light emitting device substrate of the present embodiment includes a light emitting structure forming surface on which a light emitting structure including a semiconductor layer is formed, the aforementioned light emitting structure forming surface includes a flat portion that spreads along one crystal plane, two convex portions that are protruded from the aforementioned flat portion and one bridge portion that is protruded from the aforementioned flat portion, the amount that protrudes from the aforementioned flat portion is smaller in the bridge portion than in the aforementioned convex portion, the aforementioned two convex portions are connected by the aforementioned one bridge portion, the most frequent pitch of the aforementioned convex portion is equal to or more than 100 nm and equal to or less than 5 μm, the aspect ratio of the aforementioned large number of the convex portions is from 0.5 to 1.0, and the length along the longitudinal direction of the bridge portion may be equal to or more than 50 nm and equal to or less than 300 nm.

The semiconductor light emitting device substrate of the present embodiment includes a light emitting structure forming surface on which a light emitting structure including a semiconductor layer is formed, the aforementioned light emitting structure forming surface includes a flat portion that spreads along one crystal plane, two convex portions that are protruded from the aforementioned flat portion and one bridge portion that is protruded from the aforementioned flat portion, the amount that protrudes from the aforementioned flat portion is smaller in the bridge portion than in the aforementioned convex portion, the aforementioned two convex portions are connected by the aforementioned one bridge portion, the most frequent pitch of the aforementioned convex portion is equal to or more than 100 nm and equal to or less than 5 μm, the aspect ratio of the aforementioned large number of the convex portions is from 0.5 to 1.0, and the length along the short direction of the bridge portion may be equal to or more than 10 nm and equal to or less than 100 nm.

The semiconductor light emitting device substrate of the present embodiment includes a light emitting structure forming surface on which a light emitting structure including a semiconductor layer is formed, the aforementioned light emitting structure forming surface includes a flat portion that spreads along one crystal plane, two convex portions that are protruded from the aforementioned flat portion and one bridge portion that is protruded from the aforementioned flat portion, the amount that protrudes from the aforementioned flat portion is smaller in the bridge portion than in the aforementioned convex portion, the aforementioned two convex portions are connected by the aforementioned one bridge portion, the most frequent pitch of the aforementioned convex portion is equal to or more than 100 nm and equal to or less than 5 μm, the aspect ratio of the aforementioned large number of the convex portions may be from 0.5 to 1.0, and the bridge portion height may be lower than half the height of the convex portion. In addition, the bridge portion height may be substantially zero, and, in this case, by adjusting such that the distance between the aforementioned two convex portions widens by the reduction in particle size and increasing the exposed portion of the c-plane of sapphire crystal that can be the starting point of epitaxial growth, it is possible to contribute to performing deposition of high quality with a low crystal dislocation density in the LED deposition step and obtaining a highly efficient LED light emitting device.

The semiconductor light emitting device substrate of the present embodiment is a semiconductor light emitting device substrate having an uneven structure on one surface of the substrate, the aforementioned uneven structure has a large number of convex portions and a flat surface between each of the convex portions, and also has a plurality of areas in which the central points of seven adjacent convex portions are aligned continuously in a positional relationship so as to become the six vertices and point of intersection of diagonal lines of a regular hexagon, the area, shape and lattice orientation of the aforementioned plurality of areas are random, the aspect ratio of the aforementioned large number of convex portions is from 0.5 to 1.0, and the length of the flat surfaces f11 to f1$n$ when viewed in a cross section that passes through the vertex of the convex portion and is perpendicular to the aforementioned substrate may be from 5% to 40% with respect to a straight line connecting the vertices of the two adjacent convex portions among the convex portions c11 to c1$n$.

The semiconductor light emitting device substrate of the present embodiment is a semiconductor light emitting device substrate having an uneven structure on one surface of the substrate, the aforementioned uneven structure has a large number of convex portions and a flat surface between each of the convex portions, and also has a plurality of areas in which the central points of seven adjacent convex portions are aligned continuously in a positional relationship so as to become the six vertices and point of intersection of diagonal lines of a regular hexagon, the area, shape and lattice orientation of the aforementioned plurality of areas are random, the aspect ratio of the aforementioned large number of convex portions is from 0.5 to 1.0, and the length of the flat surfaces f11 to f1$n$ when viewed in a cross section that passes through the vertex of the convex portion and is perpendicular to the aforementioned substrate may be from 15% to 25% with respect to a straight line connecting the vertices of the two adjacent convex portions among the convex portions c11 to c1$n$.

EXAMPLES

Example 1

<Production of Semiconductor Light Emitting Device>

On a sapphire substrate having a diameter of 2 inches and a thickness of 0.42 mm, $SiO_2$ colloidal silica particles having a diameter of $\phi$3 µm were coated as a monolayer by a monolayer coating method disclosed in Japanese Patent Application No. 2008-522506.

More specifically, a 3.0% by mass aqueous dispersion (dispersion liquid) of spherical colloidal silica of $SiO_2$ colloidal silica particles having an average particle size of 3.02 µm (coefficient of variation of particle size=0.85%) was prepared.

Then, brominated hexadecyltrimethylammonium (surfactant) having a concentration of 50% by mass was added to the dispersion liquid so as to be 2.5 mmol/L, and the resultant was stirred for 30 minutes to adsorb the brominated hexadecyltrimethylammonium onto the surface of the colloidal silica particles. At this time, the dispersion liquid and the brominated hexadecyltrimethylammonium were mixed so that the mass of the brominated hexadecyltrimethylammonium was 0.04 times the mass of the colloidal silica particles.

Then, to the resulting dispersion liquid, chloroform having the same volume as the volume of the dispersion liquid was added and stirred thoroughly, and the hydrophobized colloidal silica was extracted by oil phase extraction.

The thus obtained dispersion liquid of hydrophobized colloidal silica having a concentration of 1.5% by mass was added dropwise at a dropping rate of 0.01 ml/sec to a liquid surface (water was used as underlying water, at a water temperature of 25° C.) in a water tank (LB trough unit) equipped with a surface pressure sensor for measuring the surface pressure of a monolayer particle film and a movable barrier for compressing the monolayer particle film in a direction along the liquid surface. It should be noted that in the underlying water in the water tank, the sapphire substrate described above had been immersed in advance.

From during the dropwise addition, while ultrasonic wave (output: 120 W, frequency: 1.5 MHz) was irradiated from the underlying water toward the surface of the water to facilitate closest packing of particles two-dimensionally, chloroform serving as a solvent of the dispersion liquid was volatilized to form a monolayer particle film.

Then, the monolayer particle film was compressed using the movable barrier until a diffusion pressure of 18 mNm$^{-1}$ was achieved, the sapphire wafer was pulled upward at a rate of 5 mm/min, and the monolayer particle film was transferred onto one side of the substrate, thereby obtaining a sapphire wafer provided with a monolayer particle film etching mask constituted of colloidal silica.

Dry etching was carried out for reducing the particle size of the monolayer particle film etching mask constituted of colloidal silica on the thus obtained sapphire wafer. More specifically, under the conditions of an antenna power of 1,500 W, a bias of 80 W and a pressure of 5 Pa, $SiO_2$ particles having an average particle size of 3.02 µm as an initial value were reduced in size in a $CF_4$ gas so that an average particle size after the treatment was 2.80 µm.

Subsequently, dry etching for processing the sapphire wafer serving as a base material was carried out. More specifically, under the conditions of an antenna power of 1,500 W, a bias of 300 W, a pressure of 1 Pa and a temperature inside an etching chamber of 80 to 110° C., the $SiO_2$ mask/sapphire substrate was processed by dry etching in a $Cl_2$ gas to obtain a sapphire substrate for a semiconductor light emitting device provided with an uneven structure constituted by having a most frequent pitch of 3 µm, a structure height of 1.5 µm, a flat portion distance of 0.4 µm, a length of a portion corresponding to a bridge portion of 0.4 µm and a height of the portion corresponding to the bridge portion of 3 nm or less (the bridge portion was flat since the bridge portion did not have a substantial height), as shown in Table 1.

On the uneven structure surface of the thus obtained sapphire substrate for a semiconductor light emitting device, an n-type semiconductor layer, an active layer and a p-type semiconductor layer were sequentially laminated, followed by formation of a p-electrode and n-electrode to complete the semiconductor light emitting device. Each of GaN-based semiconductor layers was formed by the MOCVD (Metal Organic Chemical Vapor Deposition) method, which was generally widely used. In the MOCVD method, ammonia gas and an alkyl compound gas of a group III element, such as trimethyl gallium, trimethyl ammonium and trimethyl indium were supplied onto a sapphire substrate at a temperature environment of 700° C. to 1,000° C. to allow a thermal decomposition reaction, thereby depositing the desired crystal by epitaxial growth on the substrate.

As the configuration of the n-type semiconductor layer, 15 nm of $Al_{0.9}Ga_{0.1}N$ as a low-temperature growth buffer layer, 4.5 µm of undoped GaN, 3 µm of Si-doped GaN as an n-cladding layer and 250 nm of undoped GaN were sequentially laminated.

Since the active layer increases the probability of recombination, a multiple quantum well for improving the internal quantum efficiency was formed by sandwiching several layers with a narrow band gap. As the constitution thereof, an undoped $In_{0.15}Ga_{0.85}N$ (quantum well layer) and Si-doped GaN (barrier layer) were deposited alternately with a film thickness of 4 nm and 10 nm, respectively, so that 9 layers of the undoped $In_{0.15}Ga_{0.85}N$ and 10 layers of the Si-doped GaN were laminated.

As the p-type semiconductor layer, 15 nm of Mg-doped AlGaN, 200 nm of undoped GaN and 15 nm of Mg-doped GaN were laminated.

In a region for forming the n-type electrode, from the Mg-doped GaN serving as the p-type semiconductor layer in the outermost layer to the undoped GaN serving as the n-type semiconductor layer were removed by etching to expose the Si-doped GaN layer. An n-type electrode composed of Al and W was formed on the exposed surface, and an n-pad electrode composed of Pt and Au was formed on the n-type electrode.

A p-electrode composed of Ni and Au was formed on the entire surface of the p-type semiconductor layer, and a p-pad electrode composed of Au was formed on the p-electrode.

A semiconductor device (the size of one device was 300 µm×350 µm) in a bare chip state was formed by the above operation.

Comparative Example 1

After spin-coating a photoresist at a thickness of 750 nm on a sapphire substrate with a diameter of 2 inches and a thickness of 0.42 mm and drawing a mask having a pitch of 3 µm by a laser lithography method, fine processing by dry etching was performed to obtain a sapphire substrate for a semiconductor light emitting device provided with an uneven structure constituted by having a most frequent pitch of 3 µm, a structure height of 1.5 µm and a flat portion distance of 0.4 µm, as shown in Table 1.

On the uneven structure surface of the thus obtained sapphire substrate for a semiconductor light emitting device, the n-type semiconductor layer, active layer and p-type semiconductor layer that had the same configurations as those in Example 1 were sequentially laminated, followed by formation of a p-electrode and n-electrode to complete the semiconductor light emitting device (the size of one device was 300 µm×350 µm).

Example 2

With the exception that SiO$_2$ colloidal silica particles having an average particle size of 305 nm (coefficient of variation of particle size=3.4%) were used and the thickness of the undoped GaN serving as the n-type semiconductor layer was changed to 2.5 µm, fine processing by the particle mask method was performed in the same manner as in Example 1 to obtain a sapphire substrate for a semiconductor light emitting device provided with an uneven structure constituted by having a most frequent pitch of 300 nm, a structure height of 150 nm, a flat portion distance of 40 nm, a length of a portion corresponding to a bridge portion of 30 nm and a height of the portion corresponding to the bridge portion of 3 nm or less (the bridge portion was flat since the bridge portion did not have a substantial height), as shown in Table 1.

On the uneven structure surface of the thus obtained sapphire substrate for a semiconductor light emitting device, the n-type semiconductor layer, active layer and p-type semiconductor layer that had the same configurations as those in Example 1 were sequentially laminated, followed by formation of a p-electrode and n-electrode to complete the semiconductor light emitting device (the size of one device was 300 µm×350 µm).

Comparative Example 2

After spin-coating a photoresist at a thickness of 100 nm on a sapphire substrate with a diameter of 2 inches and a thickness of 0.42 mm and drawing a mask having a pitch of 300 nm by an electron beam lithography method, fine processing by dry etching was performed to obtain a sapphire substrate for a semiconductor light emitting device provided with an uneven structure constituted by having a most frequent pitch of 300 nm, a structure height of 150 nm and a flat portion distance of 40 nm, as shown in Table 1.

On the uneven structure surface of the thus obtained sapphire substrate for a semiconductor light emitting device, the n-type semiconductor layer, active layer and p-type semiconductor layer that had the same configurations as those in Example 1 were sequentially laminated, followed by formation of a p-electrode and n-electrode to complete the semiconductor light emitting device (the size of one device was 300 µm×350 µm).

<Evaluation Method>

The semiconductor light emitting devices (bare chips before being embedded in a resin) obtained in each of Examples and Comparative Examples that were still in the form of the bare chips were mounted on a small prober (sp-0-2Ls manufactured by ESS Tech, Inc.), and were turned on at a drive current of 20 to 40 mA using an open probe, and the following evaluations were carried out. The results are shown in Table 1.

[In-Plane Radiation Anisotropy]

The semiconductor light emitting device was mounted and lit on a rotating stage of PR50CC manufactured by Newport Corporation. While rotating the rotating stage 360 degrees at 0.5°/sec around the Z axis, the brightness was measured continuously using a CCD camera (luminance meter BM7A manufactured by Topcon Corporation) from a position at which an elevation angle was 30 degrees and a distance was 150 mm from a light emitting surface of the semiconductor light emitting device.

A curve obtained by plotting the measurement results on a graph having the brightness on a vertical axis and rotation angle on a horizontal axis and a straight line of the brightness average value from 0 to 360 degrees were drawn to overlap, and the in-plane radiation anisotropy was determined from the following equation.

In-plane radiation anisotropy=(sum of the area enclosed by the curve and the straight line)/ (average value×360 degrees)

Semiconductor light emitting devices having a large value for the in-plane radiation anisotropy exhibit radiation characteristics of high anisotropy and low uniformity with respect to the radiation in the in-plane direction. Conversely, semiconductor light emitting devices having a small value for the in-plane radiation anisotropy exhibit radiation characteristics of low anisotropy and high uniformity with respect to the radiation in the in-plane direction.

[External Quantum Efficiency]

In order to confirm the effect of improving the light extraction efficiency, the external quantum efficiency was measured using a Spectraflect integrating sphere and CDS-600-type spectroscope manufactured by Labsphere, Inc.

TABLE 1

|  | Mask production method | Most frequent pitch P | Structure height | Flat portion distance f | Ratio of maximum value and minimum value of FFT Fundamental wave | In-plane anisotropy | Improvement rate of light extraction efficiency (external quantum efficiency) |
|---|---|---|---|---|---|---|---|
| Ex. 1 | Particle coating | 3 µm | 1.5 µm | 0.4 µm | 1.15-fold | 4.1% | 52% |
| Comp. Ex. 1 | Photolithography | 3 µm | 1.5 µm | 0.4 µm | 32.50-fold | 9.0% | 53% |
| Ex. 2 | Particle coating | 300 nm | 150 nm | 40 nm | 1.05-fold | 2.9% | 87% |
| Comp. Ex. 2 | Interference exposure | 300 nm | 150 nm | 40 nm | 40.15-fold | 11.6% | 84% |

In Table 1, the flat portion distance shows an average value of the width of a flat surface present between the central points of the adjacent convex portions.

As shown in Table 1, in Example 1 and in Example 2, low in-plane radiation anisotropy was confirmed. On the other hand, in Comparative Example 1 prepared by the photolithography method and in Comparative Example 2 prepared by an interference exposure method, high in-plane radiation anisotropy was confirmed. From these results, it was found that according to the present invention, in a simpler method than conventional methods, a sufficient light extraction efficiency and low in-plane radiation anisotropy can be achieved.

Example 3

With the exception that a sapphire substrate having a TTV of 6.66 µm, a WARP of 17.06 µm and a |BOW| of 11.98 µm was used, in the same manner as in Example 1, fine processing by the particle mask method was performed to obtain a sapphire substrate for a semiconductor light emitting device provided with an uneven structure constituted by having a most frequent pitch of 3 µm, a structure height of 1.5 µm and a flat portion distance of 0.4 µm, as shown in Table 2. In addition, when each of 20 sampling positions was extracted from the central portion of the substrate and the outer periphery portion, and the shape of the convex portion was measured to determine the coefficient of variation H', the values of 1.77 and 2.12 were obtained, respectively.

On the uneven structure surface of the thus obtained sapphire substrate for a semiconductor light emitting device, the n-type semiconductor layer, active layer and p-type semiconductor layer that had the same configurations as those in Example 1 were sequentially laminated, followed by formation of a p-electrode and n-electrode to complete the semiconductor light emitting device (the size of one device was 300 µm×350 µm).

Comparative Example 3

With the exception that a sapphire substrate having a TTV of 5.24 µm, a WARP of 17.31 µm and a |BOW| of 11.07 µm was used, in the same manner as in Comparative Example 1, after producing a circular mask having a pitch of 3 µm using a laser lithography method, fine processing by dry etching was performed to obtain a sapphire substrate for a semiconductor light emitting device provided with an uneven structure constituted by having a most frequent pitch of 3 µm, a structure height of 1.5 µm and a flat portion distance of 0.4 µm, as shown in Table 2. In addition, for the coefficients of variation H' of the convex portions in the central portion of the substrate and the outer peripheral portion, the values of 4.82 and 10.45 were obtained, respectively.

On the uneven structure surface of the thus obtained sapphire substrate for a semiconductor light emitting device, the n-type semiconductor layer, active layer and p-type semiconductor layer that had the same configurations as those in Example 1 were sequentially laminated, followed by formation of a p-electrode and n-electrode to complete the semiconductor light emitting device (the size of one device was 300 µm×350 µm).

Example 4

With the exception that a sapphire substrate having a TTV of 5.89 µm, a WARP of 18.78 µm and a |BOW| of 11.02 µm was used, fine processing by the particle mask method was performed in the same manner as in Example 2 to obtain a sapphire substrate for a semiconductor light emitting device provided with an uneven structure constituted by having a most frequent pitch of 300 nm, a structure height of 150 nm and a flat portion distance of 40 nm, as shown in Table 1. In addition, for the coefficients of variation H' of the convex portions in the central portion of the substrate and the outer peripheral portion, the values of 2.51 and 2.68 were obtained, respectively.

On the uneven structure surface of the thus obtained sapphire substrate for a semiconductor light emitting device, the n-type semiconductor layer, active layer and p-type semiconductor layer that had the same configurations as those in Example 1 were sequentially laminated, followed by formation of a p-electrode and n-electrode to complete the semiconductor light emitting device (the size of one device was 300 µm×350 µm).

Comparative Example 4

With the exception that a sapphire substrate having a TTV of 5.56 µm, a WARP of 18.57 µm and a |BOW| of 10.85 µm was used, in the same manner as in Comparative Example 2, after drawing a circular mask having a pitch of 300 nm by an electron beam lithography method, fine processing by dry etching was performed to obtain a sapphire substrate for a semiconductor light emitting device provided with an uneven structure constituted by having a most frequent pitch of 300 nm, a structure height of 150 nm and a flat portion distance of 40 nm, as shown in Table 1. In addition, for the coefficients of variation H' of the convex portions in the central portion of the substrate and the outer peripheral portion, the values of 5.09 and 10.13 were obtained, respectively.

On the uneven structure surface of the thus obtained sapphire substrate for a semiconductor light emitting device, the n-type semiconductor layer, active layer and p-type semiconductor layer that had the same configurations as those in Example 1 were sequentially laminated, followed by formation of a p-electrode and n-electrode to complete the semiconductor light emitting device (the size of one device was 300 μm×350 μm).

<Evaluation Method>

For the semiconductor light emitting devices (bare chips before being embedded in a resin) obtained in each of Examples and Comparative Examples, each of 20 points was extracted from the central portion of the substrate and the outer periphery portion, and still in the form of the bare chips, they were mounted on a small prober (sp-0-2Ls manufactured by ESS Tech, Inc.), and were turned on at a drive current of 20 to 40 mA using an open probe, and the following evaluations were carried out. The results are shown in Table 2.

[External Quantum Efficiency]

In order to confirm the effect of improving the light extraction efficiency, the external quantum efficiency was measured using a Spectraflect integrating sphere and CDS-600-type spectroscope manufactured by Labsphere, Inc.

uniformity of the uneven structure was maintained with high accuracy and a sufficient light extraction efficiency could be achieved.

Example 5

With the exception that $SiO_2$ colloidal silica particles having an average particle size of 1.06 μm (coefficient of variation of particle size=3.1%) were used and the thickness of the undoped GaN serving as the n-type semiconductor layer was changed to 4.0 μm, fine processing by the particle mask method was performed in the same manner as in Example 1 to obtain a sapphire substrate for a semiconductor light emitting device provided with an uneven structure constituted by having a most frequent pitch of 1.0 μm, a structure height of 510 nm, a length of the bridge portion of 280 nm and a height of the bridge portion of 106 nm, as shown in Table 1.

TABLE 2

| | Mask production method | Most frequent pitch P | Structure height | Flat portion distance f | TTV | WARP | \|BOW\| |
|---|---|---|---|---|---|---|---|
| Ex. 3 | Particle coating | 3 μm | 1.5 μm | 0.4 μm | 6.66 μm | 17.06 μm | 11.98 μm |
| Comp. Ex. 3 | Photolithography | 3 μm | 1.5 μm | 0.4 μm | 5.24 μm | 17.31 μm | 11.07 μm |
| Ex. 4 | Particle coating | 300 nm | 150 nm | 40 nm | 5.89 μm | 18.78 μm | 11.02 μm |
| Comp. Ex. 4 | Interference exposure | 300 nm | 150 nm | 40 nm | 5.56 μm | 18.57 μm | 10.85 μm |

| | In-plane central portion (N = 20) | | | In-plane outer peripheral portion (N = 20) | | |
|---|---|---|---|---|---|---|
| | Coefficient of variation H' | Improvement rate of light extraction efficiency (external quantum efficiency) | Standard deviation | Coefficient of variation H' | Improvement rate of light extraction efficiency (external quantum efficiency) | Standard deviation |
| Ex. 3 | 1.77 | 53% | 0.35 | 2.12 | 52% | 0.34 |
| Comp. Ex. 3 | 4.82 | 48% | 0.45 | 10.45 | 40% | 1.60 |
| Ex. 4 | 2.51 | 86% | 0.89 | 2.68 | 84% | 0.93 |
| Comp. Ex. 4 | 5.09 | 78% | 1.46 | 10.13 | 69% | 2.14 |

In Table 2, it is shown that the larger the coefficient of variation H' of the convex portions, the less the in-plane uniformity of the uneven structure on the sapphire substrate is maintained, and also the standard deviation indicates variations in the improvement rate of the light extraction efficiency at each measurement position.

As shown in Table 2, in Example 3 and Example 4, in both the central portion and the outer periphery portion within the plane, since the coefficients of variation H', the improvement rates of the light extraction efficiency and the standard deviations of the improvement rate of the light extraction exhibit substantially the same value, it was confirmed that the in-plane uniformity of the uneven structure on the sapphire substrate was high. On the other hand, in Comparative Example 3 prepared by the photolithography method and in Comparative Example 4 prepared by an interference exposure method, it was confirmed that there was a large difference in the above values in the central portion and the outer peripheral portion within the plane. From these results, according to Examples 3 and 4, even if a substrate having a relatively low flatness with a TTV of 5 μm to 30 μm, a WARP of 10 μm to 50 μm and a \|BOW\| of 10 μm to 50 μm was used, it was found that in-plane On the uneven structure surface of the thus obtained sapphire substrate for a semiconductor light emitting device, the n-type semiconductor layer, active layer and p-type semiconductor layer that had the same configurations as those in Example 1 were sequentially laminated, followed by formation of a p-electrode and n-electrode to complete the semiconductor light emitting device (the size of one device was 300 μm×350 μm).

Comparative Example 5

After spin-coating a photoresist at a thickness of 300 nm on a sapphire substrate with a diameter of 2 inches and a thickness of 0.42 mm and drawing a mask having a pitch of 1 μm by a laser lithography method, fine processing by dry etching was performed to obtain a sapphire substrate for a semiconductor light emitting device provided with an uneven structure constituted by having a most frequent pitch of 1 μm, a structure height of 500 μm and a flat portion distance of 290 nm, as shown in Table 3.

On the uneven structure surface of the thus obtained sapphire substrate for a semiconductor light emitting device, the n-type semiconductor layer, active layer and p-type semiconductor layer that had the same configurations as those in Example 1 were sequentially laminated, followed by formation of a p-electrode and n-electrode to complete the semiconductor light emitting device (the size of one device was 300 μm×350 μm).

<Evaluation Method>

The semiconductor light emitting devices (bare chips before being embedded in a resin) obtained in each of Examples and Comparative Examples that were still in the form of the bare chips were mounted on a small prober (sp-0-2Ls manufactured by ESS Tech, Inc.), and were turned on at a drive current of 20 to 40 mA using an open probe, and the following evaluations were carried out. The results are shown in Table 3.

[External Quantum Efficiency]

In order to confirm the effect of improving the light extraction efficiency, the external quantum efficiency was measured using a Spectraflect integrating sphere and CDS-600-type spectroscope manufactured by Labsphere, Inc.

TABLE 3

| | Mask production method | Most frequent pitch P | Structure height | Distance of location corresponding to bridge portion | Bridge height | Improvement rate of light extraction efficiency (external quantum efficiency) |
|---|---|---|---|---|---|---|
| Ex. 5 | Particle coating | 1 μm | 510 nm | 280 nm | 106 nm | 65% |
| Comp. Ex. 5 | Photolithography | 1 μm | 500 nm | 290 nm | 0 nm | 59% |

As shown in Table 3, since the bridge portion is provided in the fine structure in Example 5, the external quantum efficiency is about 10% higher as compared to Comparative Example 5 where the bridge portion is absent. It is interpreted that in Example 5, this is because the light confined inside the LED element becomes a waveguide mode and scatters due to the presence of the bridge portion to be taken out from the light extraction surface. On the other hand, in Comparative Example 5 where the bridge portion is absent, because there is no light extraction effect as described above, the external quantum efficiency is poor.

INDUSTRIAL APPLICABILITY

A semiconductor light emitting device substrate in which crystal defects in the semiconductor layer are less likely to occur, a sufficient light extraction efficiency is achieved and the color shift is also prevented is provided by a simple method.

REFERENCE SIGNS LIST

11: Semiconductor light emitting device substrate; C1: Area; c11: Convex portion; f11: Flat surface; t11: Central point; S1: Substrate; M1: Particle; F1: Monolayer particle film; W1: Underlying water; V1: Water tank; S21: First exposed portion; S22: Second exposed portion; TP2: Convex portion pair; TG2: Convex portion group; TL2: Convex portion team; 211B: Device substrate; 211S: Light emitting structure forming surface; 212: Convex portion; 213: Bridge portion; 213T: Top surface; 214: flat portion; 221: Light emitting structure

What is claimed is:

1. A method of manufacturing a semiconductor light emitting device substrate, the method comprising:

arranging a plurality of particles in a monolayer on a substrate so that an arrangement deviation D (%) defined by a formula (1) shown below is not greater than 15%;

dry etching said plurality of particles arranged to provide a void between the particles in a condition in which said particles are etched while said substrate is not substantially etched; and dry etching said substrate by using the plurality of particles after said particle etching as an etching mask, thereby forming an uneven structure on one side of said substrate:

$$D[\%]=|B-A|\times 100/A \qquad (1)$$

with a proviso that in formula (1), A denotes an average particle diameter of particles, B denotes a most frequent pitch between particles; and

|B−A| denotes an absolute value of difference between A and B, wherein an absolute difference (TTV) between a maximum thickness and a minimum thickness of said substrate is from 5 μm to 30 μm, a difference (WARP) between a maximum value and a minimum value of deviation from a reference plane is from 10 μm to 50 μm, and an absolute value (|BOW|) of a distance from a reference plane at a central portion of the substrate is from 10 μm to 50 μm.

2. The method of manufacturing a semiconductor light emitting device substrate according to claim 1, wherein said particle arranging comprises:

adding a dispersion liquid dropwise in which particles are dispersed in a solvent having a smaller specific gravity than water to a liquid surface of water inside a water tank;

forming a monolayer particle film comprising said particle on a liquid surface of water by vaporizing said solvent; and transferring said monolayer particle film onto a substrate.

3. The method of manufacturing a semiconductor light emitting device substrate according to claim 1, wherein the most frequent pitch between said particles is not greater than 5 μm.

4. The method of manufacturing a semiconductor light emitting device substrate according to claim 1, wherein the most frequent pitch between said particles is not greater than 1 μm.

5. The method of manufacturing a semiconductor light emitting device substrate according to claim 1, wherein the most frequent pitch between said particles is from 200 nm to 700 nm.

6. A method of manufacturing a semiconductor light emitting device, the method comprising:

obtaining a light emitting device substrate by the manufacturing method according to claim 1; and laminating a semiconductor functional layer including at least a light emitting layer on a surface of the obtained light emitting device substrate where an uneven structure is formed.

7. A method of manufacturing a semiconductor light emitting device substrate, the method comprising:
arranging a plurality of particles in a monolayer on a substrate;
dry etching said plurality of particles arranged to provide a void between the particles in a condition in which said particles are etched while said substrate is not substantially etched; and
dry etching said substrate by using the plurality of particles after said particle etching as an etching mask, thereby forming an uneven structure on one side of said substrate,
wherein said substrate is sapphire, said particles are silica, said particle etching uses at least one type of gas selected from the group consisting of $CF_4$, $SF_6$, $CHF_3$, $C_2F_6$, $C_3F_8$, $CH_2F_2$, $O_2$ and $NF_3$ as an etching gas, and said substrate etching uses at least one type of gas selected from the group consisting of $Cl_2$, $Br_2$, $BCl_3$, $SiCl_4$, HBr, HI, HCl and Ar as an etching gas, and
wherein an absolute difference (TTV) between a maximum thickness and a minimum thickness of said substrate is from 5 μm to 30 μm,
a difference (WARP) between a maximum value and a minimum value of deviation from a reference plane is from 10 μm to 50 μm, and an absolute value (|BOW|) of a distance from a reference plane at a central portion of the substrate is from 10 μm to 50 μm.

8. The method of manufacturing a semiconductor light emitting device substrate according to claim 7,
wherein said particle arranging comprises:
adding a dispersion liquid dropwise in which particles are dispersed in a solvent having a smaller specific gravity than water to a liquid surface of water inside a water tank;
forming a monolayer particle film comprising said particle on a liquid surface of water by vaporizing said solvent; and
transferring said monolayer particle film onto a substrate.

9. A method of manufacturing a semiconductor light emitting device, the method comprising:
obtaining a light emitting device substrate by the manufacturing method according to claim 7; and
laminating a semiconductor functional layer including at least a light emitting layer on a surface of the obtained light emitting device substrate where an uneven structure is formed.

* * * * *